United States Patent [19]

Sahara et al.

[11] Patent Number: 5,485,062
[45] Date of Patent: Jan. 16, 1996

[54] HORIZONTAL DEFLECTION CIRCUIT FOR A TELEVISION SET

[75] Inventors: Hiroshi Sahara, Kanagawa; Isao Osawa, Miyagi, both of Japan

[73] Assignee: Sony Corporation, Tokyo, Japan

[21] Appl. No.: 181,067

[22] Filed: Jan. 14, 1994

[30] Foreign Application Priority Data

Jan. 18, 1993 [JP] Japan .................................. 5-005929
Mar. 12, 1993 [JP] Japan .................................. 5-052508
Mar. 12, 1993 [JP] Japan .................................. 5-052516

[51] Int. Cl.⁶ .............................. G09G 1/04; H01J 29/70
[52] U.S. Cl. ........................................................ 315/408
[58] Field of Search ...................................... 315/408, 411

[56] References Cited

U.S. PATENT DOCUMENTS

| | | | |
|---|---|---|---|
| 4,027,200 | 5/1977 | Sahara et al. | 315/411 |
| 4,529,917 | 7/1985 | Chin et al. | 315/411 |
| 4,864,197 | 9/1989 | Fitzgerald | 315/408 |
| 4,906,904 | 3/1990 | Togoni | 315/408 |
| 5,051,668 | 9/1991 | Kawaberi et al. | 315/408 |
| 5,068,581 | 11/1991 | Nishiura et al. | 315/370 |

*Primary Examiner*—Gregory C. Issing
*Attorney, Agent, or Firm*—Jay H. Maioli

[57] ABSTRACT

In a horizontal deflection circuit for a television receiver, the output signal of a horizontal oscillation circuit is supplied to a driving circuit, and the output of a transistor included in the driving circuit is applied to the gate of a MOSFET. A current flowing in one direction is supplied to the MOSFET in a part of the horizontal scanning period and a current flowing in the other direction is supplied to the MOSFET in the rest of the horizontal scanning period so that a sawtooth current flows through a horizontal deflection coil.

12 Claims, 21 Drawing Sheets

HORIZONTAL DEFLECTION CIRCUIT FOR A TELEVISION SET

BACKGROUND OF THE INVENTION

1. Field of the Invention

The present invention relates to a horizontal deflection circuit for a television receiver and, more particularly, to a horizontal deflection circuit for a cathode-ray tube (hereinafter abbreviated to "CRT").

2. Description of the Related Art

A flat CRT having an electron gun and a fluorescent screen inclined at comparatively small angles to the center axis of the electron gun, is disclosed in, for example, Japanese Patent Laid-open No. 59-175547. This flat CRT is provided with a horizontal deflection circuit to supply a sawtooth current to the horizontal deflection coils of the flat CRT. In a conventional horizontal deflection circuit, a horizontal drive circuit applies horizontal driving pulses to the base of the transistor. Upon the application of a positive pulse to the base of the transistor, the transistor is turned on and, consequently, a current increasing with time is supplied to the deflection coils.

When a negative pulse is applied to the base of the transistor, the transistor is turned off. However, a resonant capacitor supplies a current to the deflection coils. Thereafter the current supplied to the deflection coils flows through a damping diode. However, power loss in the damping diode is a problem. If the damping diode is omitted, the current flows through the base-collector diode junction of the transistor. However, omission of the damping diode is disadvantageous to the horizontal deflection circuit in power loss and the linearity of scanning.

SUMMARY OF THE INVENTION

Accordingly, it is the first object of the present invention to provide an improved horizontal deflection circuit for a television receiver.

A second object of the present invention is to provide a horizontal deflection circuit for a television receiver that entails comparatively small power loss.

A third object of the present invention is to provide a horizontal deflection circuit for a television receiver that enables the television receiver to display pictures in a high picture quality.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
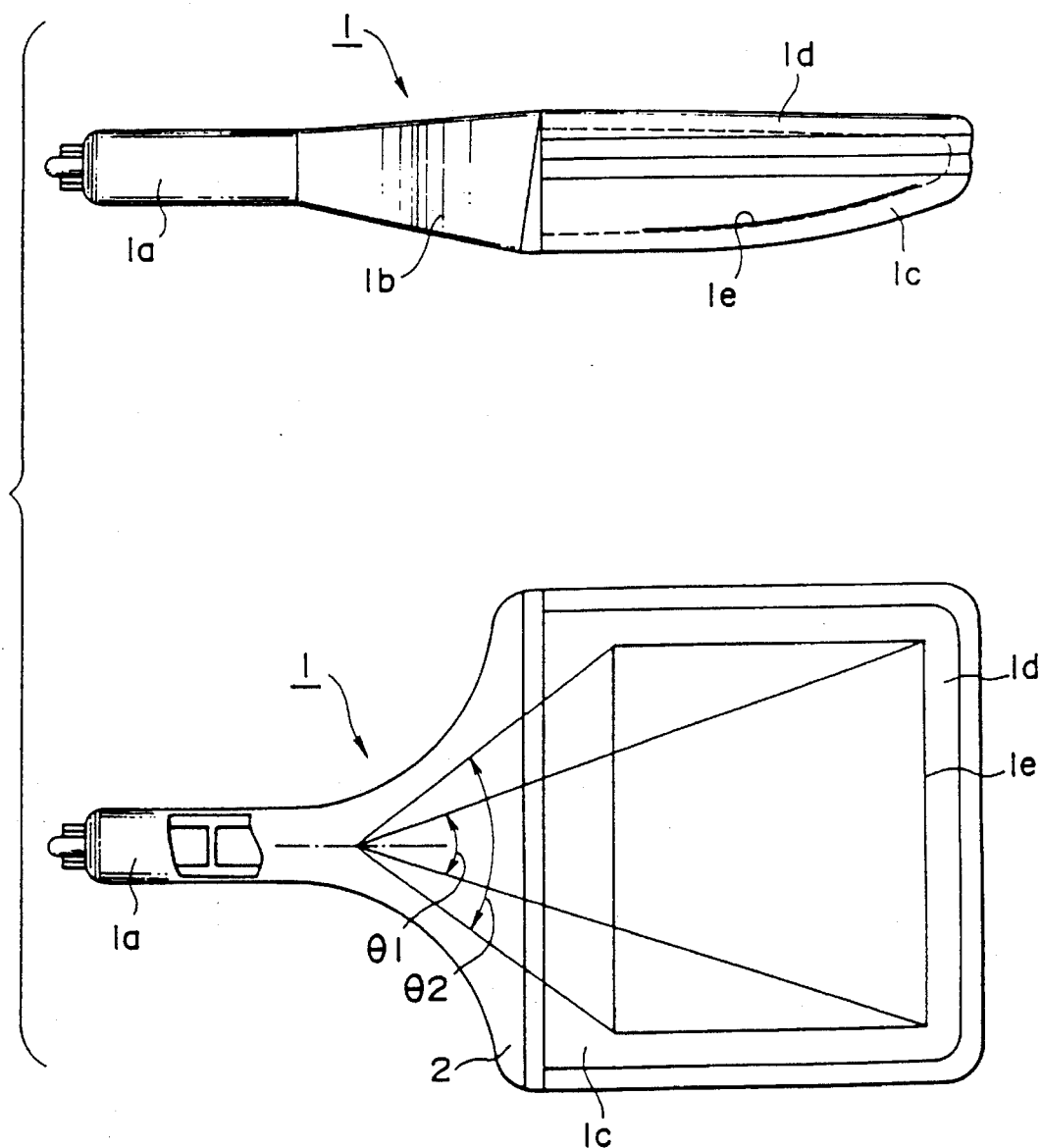
FIG. 1 includes a side view and a front view of a flat CRT.

Referring to FIG. 1, a flat CRT 1 has a neck section 1a internally provided with an electron gun, not shown, a funnel section 1b, a screen panel 1c formed of transparent glass, a front panel 1d formed of transparent glass, and a fluorescent screen 1e formed on the screen panel 1c. The fluorescent screen 1e is inclined at a comparatively small angle to the center axis of the electron gun. Pictures displayed on the fluorescent screen 1e are watched from the side of the front panel 1d in a direction substantially perpendicular to the center axis of the electron gun.

Keystone distortion occurs necessarily in this flat CRT due to the construction of the flat CRT. The fluorescent screen 1e is scanned for horizontal deflection scanning from the top thereof downward. Since the top deflection angle $\theta_1$, through which the electron beam is deflected when scanning the top of the fluorescent screen 1e and the bottom deflection angle $\theta_2$, through which the electron beam is deflected when scanning the bottom of the fluorescent screen 1e are different from each other, the scanning amplitude decreases with the distance from the top of the fluorescent screen 1e to cause keystone distortion when the deflection power (deflection current) is fixed.

The horizontal deflection current must be increased gradually when the fluorescent screen 1e is scanned from the top downward to correct for the keystone distortion. The relation between the supply voltage for the horizontal deflection circuit and the horizontal deflection current $I_{pp}$ is expressed by:

$$e_0 = L_y(I_{pp}/T_s) = K \cdot I_{pp} \quad K = L_y/T_s$$

where $e_0$ is the supply voltage, $I_{pp}$ is the horizontal deflection current, and $L_y$ is the inductance of the horizontal deflection coils (H.DY). As is obvious from the foregoing equation, the supply voltage $e_0$ must be varied dynamically to increase the horizontal deflection current $I_{pp}$ dynamically. Generally, the supply voltage is modulated by a sawtooth signal from the so-called power supply modulation system.

CRTs are provided with either a circuit of the separate type separately comprising a horizontal deflection circuit and a high-voltage circuit or a circuit of the conventional type integrally comprising a horizontal deflection circuit and a high-voltage circuit. The circuit of the conventional type is suitable for a CRT in which the distortion of pictures, such as pincushion distortion or keystone distortion, is insignificant. The circuit of the conventional type is unsuitable for a CRT in which the distortion of pictures is significant, because the correction of distortion affects the high-voltage circuit greatly. Since the keystone distortion of pictures is significant in the flat CRT as mentioned above, a circuit of the separate type is employed in the flat CRT.

Figure 2:
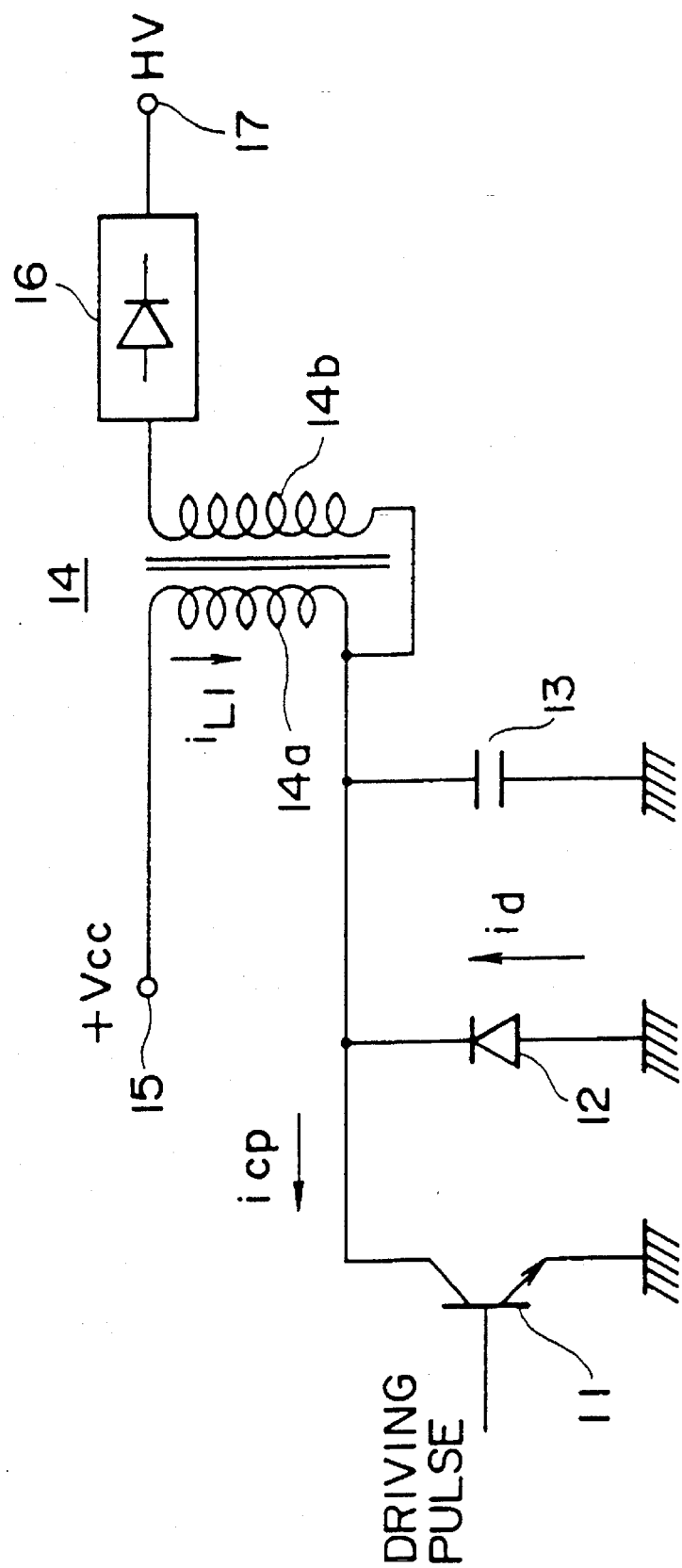
FIG. 2 is a circuit diagram of a separate type high-voltage circuit.
Figure 3:
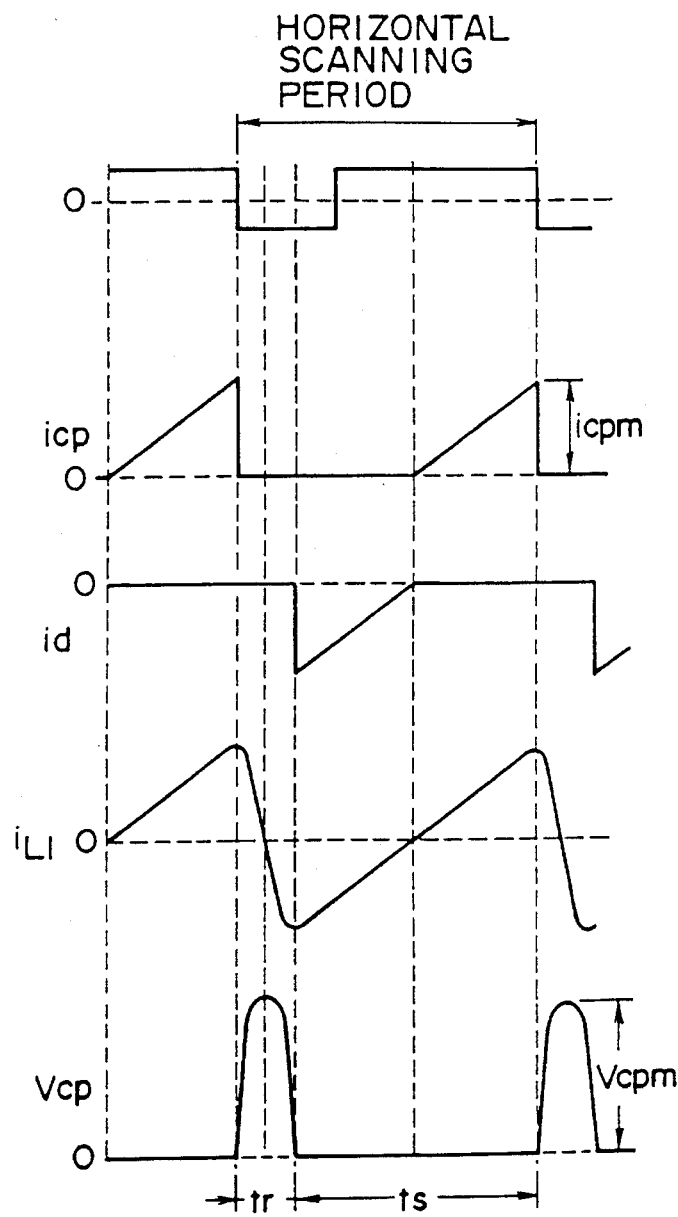
FIGS. 3A, 3B, 3C, 3D and 3E are diagrams respectively showing the waveforms of a driving pulse signal, a collector current, a damping current, a low-voltage coil current and a collector voltage (resonance pulse voltage) that appear in the high-voltage circuit of FIG. 2.

Referring to FIG. 2 showing a high-voltage circuit included in a circuit of the separate type, a driving pulse signal provided by a high-voltage driving circuit, not shown, is applied to the base of a high-voltage output transistor 11. The emitter of the transistor 11 is connected to a ground. A parallel circuit of a damping diode 12 and a resonant capacitor 13 are connected across the collector of the transistor 11 to the ground. The collector of the transistor 11 is connected through the low-voltage coil 14a (primary coil) of a flyback transformer 14 (hereinafter abbreviated to "FBT"), i.e., a high voltage generating transformer, to a power terminal 15 to which a dc voltage $+V_{cc}$ is applied. The high-voltage coil 14b (secondary coil) of the FBT 14 has one end connected to a high-voltage rectifier circuit 16. The high-voltage rectifier circuit 16 rectifies an increased pulse voltage that appears at one end of the high-voltage coil 14b, and the rectified high-voltage HV is applied to an output terminal 17. The other end of the high-voltage coil 14b of the FBT 14 is connected to one end of the low-voltage coil 14a.

FIGS. 3A to 3E show a driving pulse signal for one horizontal scanning period to be applied to the base of the transistor 11, a collector current $i_{cp}$, a damping current $i_d$, a current $i_{L1}$ that flows through the low-voltage coil 14a and a collector voltage $V_{cp}$, respectively. In FIGS. 3A to 3E, $t_r$ is a blanking interval and $t_s$ is a scanning interval.

The maximum value of the collector current $i_{cp}$ is calculated by expression (1):

$$V_{cc} = L_1 \cdot di/dt = L_1 \cdot i_{cpm}/(t_r/2) \quad \therefore i_{cpm} = (t_r/2)(V_{cc}/L_1) \quad (1)$$

where, $L_1$ is the inductance of the low-voltage coil 14a of the FBT 14, and $i_{cpm}$ is the maximum value of the collector current $i_{cp}$. Therefore, the current $i_L$ in that flows through the low-voltage coil 14a in the blanking interval $t_r$ is:

$$i_L = i_{cpm} \cdot \cos \omega_0 t \quad (2)$$

where $\omega_0$ is the resonance angular frequency of the low-voltage coil 14a and the resonant capacitor 13. Then, the resonance angular frequency $\omega_0$ is expressed by:

$$\omega_0 = 2\pi f_0 = 1/\sqrt{L_1 \cdot C_1} \quad (3)$$

where $L_1$ is the inductance of the low-voltage coil 14a, $C_1$ is the capacitance of the resonant capacitor 13 and $f_0$ is the resonance frequency. Half of the reciprocal of the resonance frequency $f_0$ is equal to the blanking interval $t_r$.

$$t_r = \frac{1}{2} f_0 \quad (4)$$

From expression (2), $$L_1 \cdot di_L/dt = -\omega_0 L_1 \cdot i_{cpm} \sin \omega_0 tm \quad (5)$$

Therefore, the maximum value $V_{cpm}$ of the collector voltage $V_{cp}$ is expressed by:

$$V_{cpm} = \omega_0 L_1 \cdot i_{cpm} + V_{cc} = \omega_0 L_1 \cdot (t_r/2)(V_{cc}/L_1) + V_{cc} = V_{cc}(1+\pi f_0 t_s) = V_{cc}\{1+ (\pi/2)(t_s/t_r)\} \quad (6)$$

The high-voltage circuit shown in FIG. 2 develops a high-voltage HV from the pulse voltage obtained by raising the resonance pulse voltage expressed by expression (6) at the turn ratio of the FBT 14. As is obvious from expression (6), the shorter the blanking period $t_r$, the higher is the collector voltage $V_{cpm}$ and, as is obvious from expressions (3) and (4), the blanking interval $t_r$ is dependent on the inductance $L_1$ of the low-voltage coil and the capacitance $C_1$ of the resonant capacitor 13. Accordingly, both variations of the inductance $L_1$ and the capacitance $C_1$ must be taken into consideration to maintain the high-voltage HV constant.

A protective circuit, which functions upon the detection of an abnormally high voltage, or a four-leg capacitor as resonant capacitor 13, is employed to prevent abnormally-high-voltage failure. The four-leg capacitor is provided with a pair of terminal pins connected to each of its terminals, and the two pairs of terminal pins are connected to a printed-circuit board to reduce the probability of open state attributable to the disconnection of the capacitor from the circuit.

However, small CRTs, such as flat CRTs, use a comparatively low high-voltage HV for safety because small CRTs are compact and are manufactured at a comparatively low cost. However, when the comparatively low high-voltage HV is used for driving the CRT, the acceleration of electrons of the electron beam is reduced and the focusing capability of the CRT deteriorated, entailing the reduction of resolution and the deterioration of picture quality.

Figure 4:
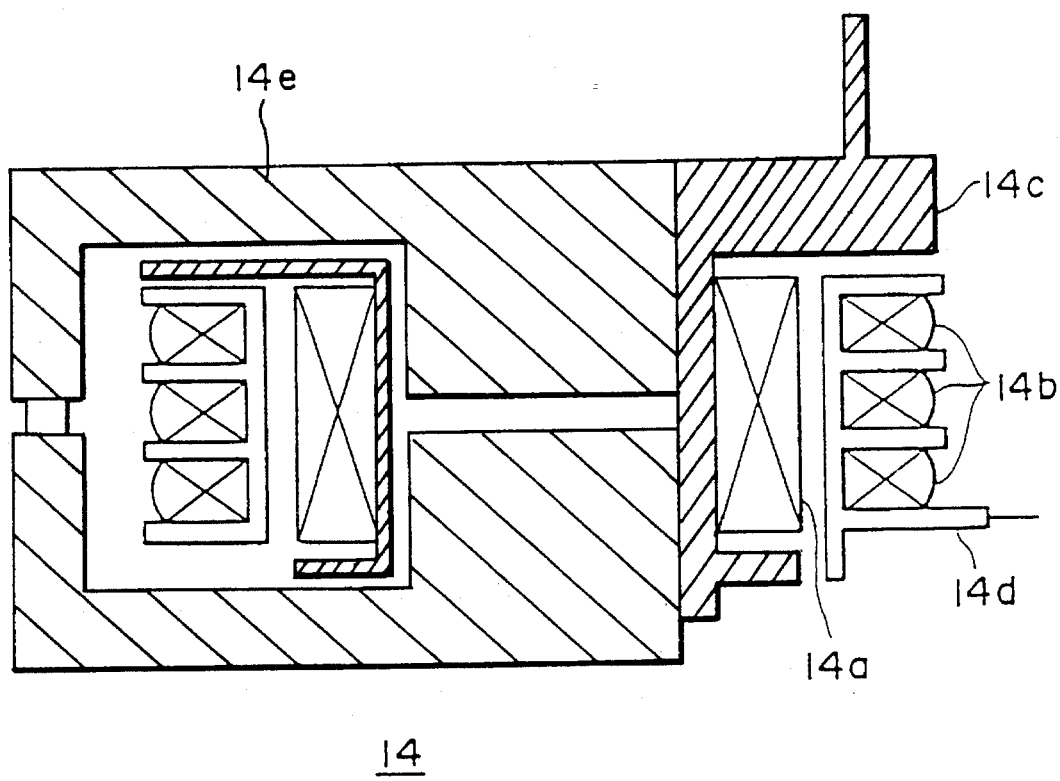
FIG. 4 is a schematic sectional view of a conventional flyback transformer.

Referring to FIG. 4 showing a conventional FBT 14, a low-voltage coil 14a is wound on a low-voltage bobbin 14c, and a high-voltage coil 14b is wound on a high-voltage bobbin 14d, and the low-voltage bobbin 14c and the high-voltage bobbin 14d are combined with a core 14e. In this FBT 14, the low-voltage coil 14a and the high-voltage coil 14b are wound respectively on the separate bobbins 14c and 14d in a concentric arrangement so that the low-voltage coil 14a and the high-voltage coil 14b are coupled closely and the distributed capacitance is reduced to suppress the adverse effect of leakage flux, such as high-voltage variation and raster ringing.

Figure 5:
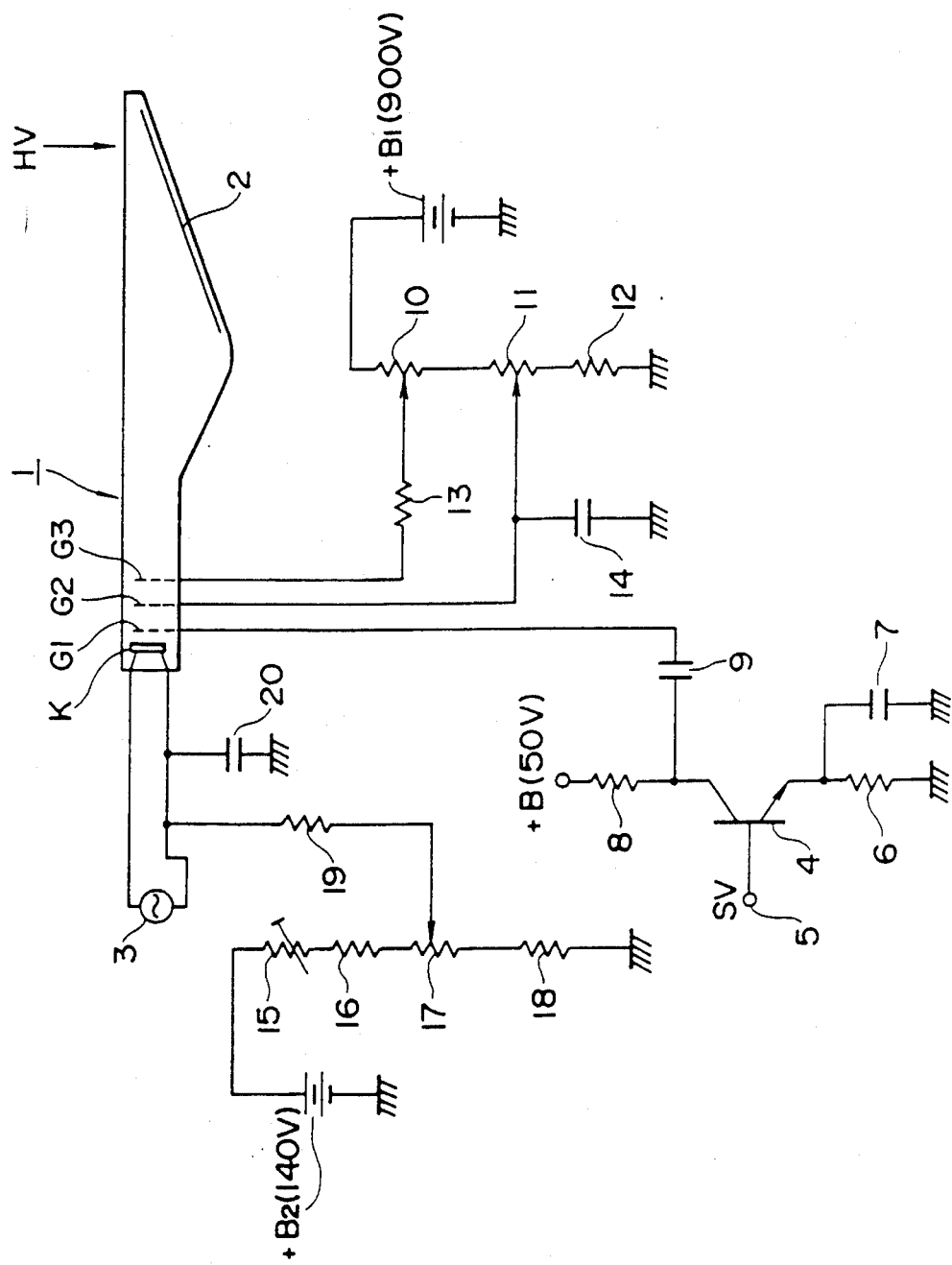
FIG. 5 is a circuit diagram of a driving circuit for driving a flat CRT.

Referring to FIG. 5 showing a driving circuit for driving a flat CRT 1, there are shown a cathode K, a first grid $G_1$, a second grid $G_2$ serving as an accelerating grid, a third grid $G_3$ serving as a focusing electrode, and a fluorescent screen 2. A high voltage HV developed by rectifying the output pulse voltage of a FBT is applied to the fluorescent screen 2. The cathode K is a directly heated electrode which is capable of being operated by a comparatively low power and of quickly rising, instead of an indirectly heated electrode which is employed generally in CRTs. The output pulse voltage of the FBT is applied as a heater voltage 3 to the cathode K for pulse ignition. Since the coil of the FBT is connected to the cathode K, the stray capacitance of the cathode K increases and, when a cathode drive system which applies video signals to the cathode K is employed, the power loss of the video circuit increases; that is, since the impedance of the output side of the video circuit must be reduced so that the influence of the stray capacitance is ignorable and an emitter follower configuration is employed to improve frequency characteristics, the loss of the video circuit increases.

Therefore, a driving system that applies video signals to the first grid $G_1$ having a comparatively small stray capacitance is employed. Video signals SV are applied to a terminal 5 connected to the base of an npn transistor 4, i.e., a component of a video signal amplifier. A parallel circuit of a resistor 6 and a capacitor 7 is connected across the emitter of the transistor 4 and the ground, and the collector of the same is connected through a resistor 8 to a power terminal +B to which a voltage of, for example, 50 V is applied.

Video signals that appear at the junction point of the collector of the transistor 4 and the resistor 8 are applied through a capacitor 9 to the first grid $G_1$ of the CRT 1. A power supply +B1 having an output voltage of, for example, 900 V is connected through a series circuit of a focusing variable resistor 10, a cutoff adjusting variable resistor 11 and a resistor 12 to the ground. A voltage that appears at the movable terminal of the variable resistor 10 is applied through the resistor 13 to the third grid $G_3$ of the CRT 1. A capacitor 14 is connected across the movable terminal of the variable resistor 11 and the ground. A voltage that appears at the junction point of the movable terminal of the variable resistor 11 and the capacitor 14 is applied to the second grid $G_2$ of the CRT 1.

A power supply +B2 having an output voltage of, for example, 140 V is connected through a subbrightness adjusting preset resistor 15, a resistor 16, a brightness adjusting resistor 17, and a resistor 18 included in a constant-current circuit to the ground. A voltage that appears at the movable terminal of the variable resistor 17 is applied through a resistor 19 to the cathode K.

Voltages applied to the second grid $G_2$ and the cathode K are varied to adjust the cutoff of the CRT 1. Voltage applied to the second grid $G_2$ is adjusted by adjusting the variable resistor 11 to determine the cutoff of the CRT 1, and voltage applied to the cathode K is adjusted by adjusting the preset resistor 15 to determine subbrightness. Since the voltage applied to the cathode K is varied through the adjustment of the subbrightness by means of the preset resistor 15 and the adjustment of brightness by means of the variable resistor 17, the resistor 19 has a comparatively high resistance of, for example, 100 kΩ. However, as is generally known, when a beam current of an intensity proportional to the magnitude of the video signal flows into the cathode K, the circuit impedance must be held on a low level. Therefore, the cathode K of the CRT 1 is grounded through the capacitor 20 to reduce the ac impedance.

Figure 6:
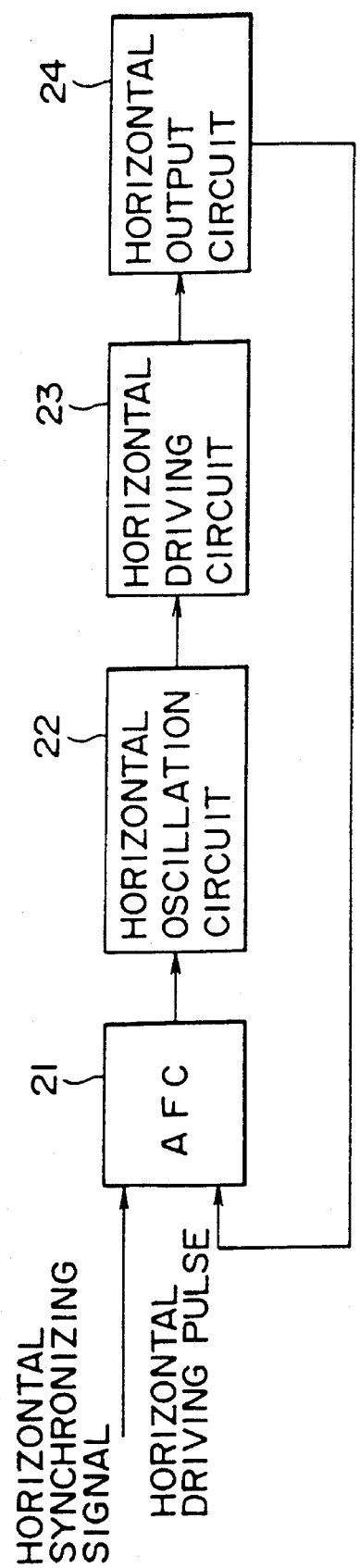
FIG. 6 is a block diagram of a conventional horizontal deflection circuit included in a television receiver provided with a CRT or a conventional flat CRT.

FIG. 6 shows a horizontal deflection circuit for a television receiver provided with one of the well-known CRTs including flat CRTs. Referring to FIG. 6, an AFC circuit 21 receives a horizontal synchronizing signal separated from a video signal SV, and a horizontal pulse signal provided by a horizontal output circuit 24, then compares the horizontal synchronizing signal and the horizontal output signal, and then gives an error signal as a control signal to a horizontal oscillation circuit 22. Then, the horizontal oscillation circuit 22 gives an oscillation output signal through a horizontal driving circuit 23 to the horizontal output circuit 24.

Figure 7:
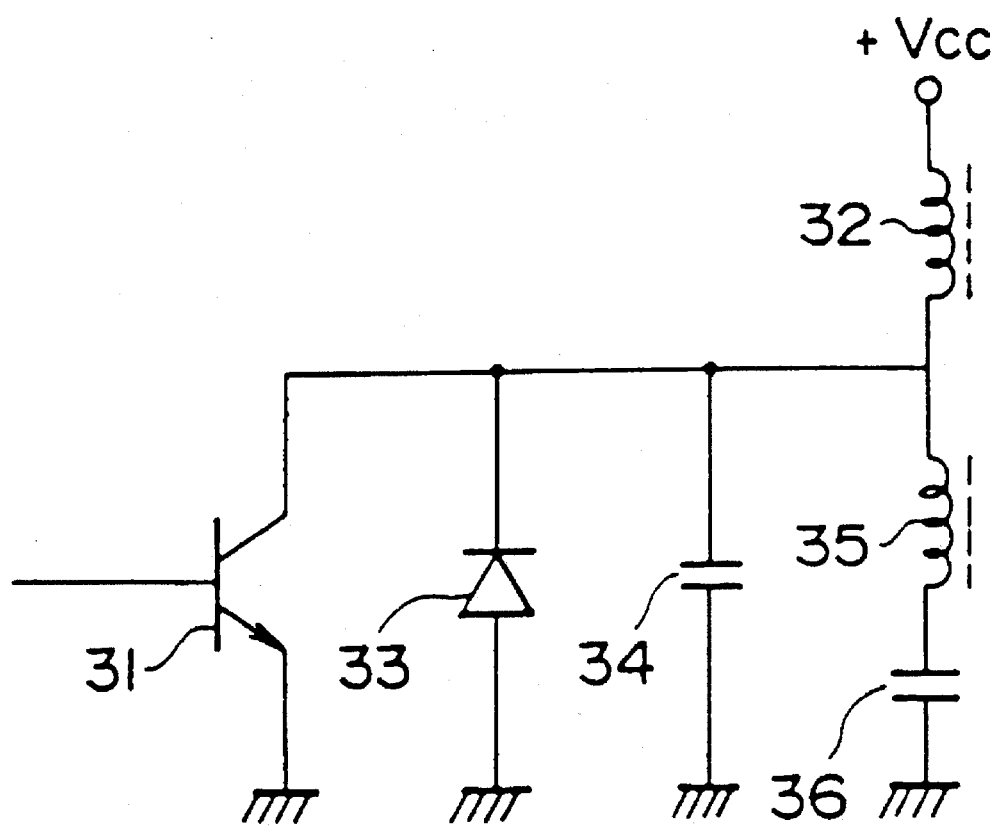
FIG. 7 is a circuit diagram of a horizontal output circuit.

Referring to FIG. 7 showing the configuration of the horizontal output circuit 24, the horizontal driving pulse signal provided by the horizontal driving circuit 23 is applied to the base of a horizontal output transistor 31 having an emitter connected to the ground and a collector connected through the primary coil 32 of a FBT to a power terminal $+V_{cc}$. A damping diode 33, a resonant capacitor 34, and a series circuit of a horizontal deflection coil 35 and an S-shape distortion correcting capacitor 36 are connected across the collector of the transistor 31 and the ground.

Figure 8A:
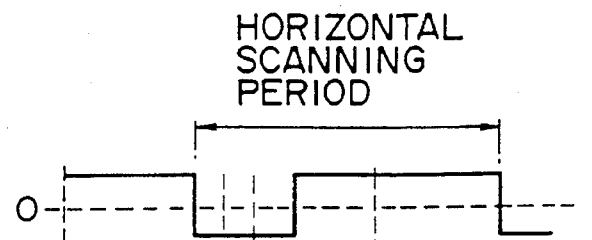
FIGS. 8A, 8B, 8C, 8D and 8E are diagrams respectively showing the waveforms of a horizontal driving pulse signal, a collector current, a deflection current, a damping current and a collector voltage that appear in the horizontal output circuit of FIG. 7.
Figure 8B:
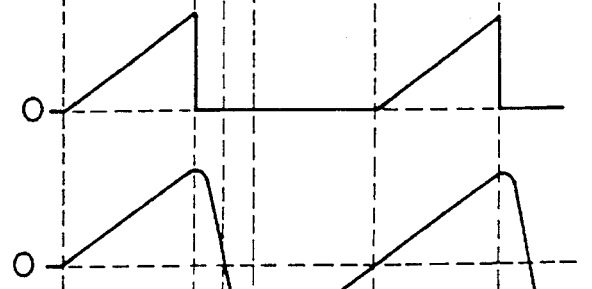
Figure 8C:
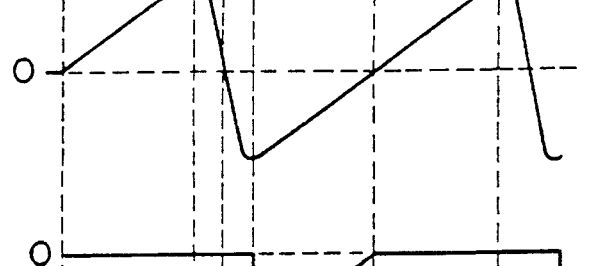
Figure 8D:
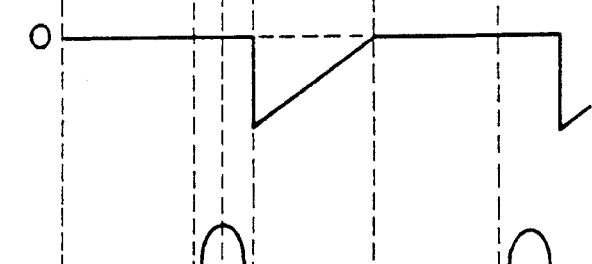
Figure 8E:
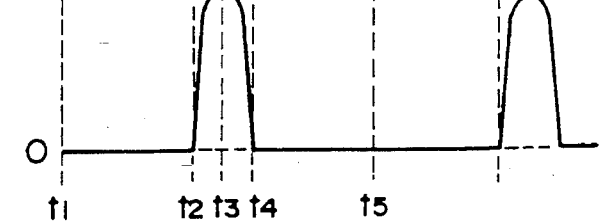

Referring to FIGS. 8A to 8E, when a horizontal driving pulse signal shown in FIG. 8A is applied to the base of the transistor 31, a sawtooth deflection current shown in FIG. 8C flows through the horizontal deflection coil 35. When a positive pulse is applied to the base of the transistor 31, the transistor 31 is turned on and the deflection current flowing through the horizontal deflection coil 35 increases linearly with time in a period between the times $t_1$ and $t_2$. When a negative pulse is applied to the base of the transistor 31, the transistor 31 is turned off. However, the deflection current continues to flow in the same direction by the inertial of inductance to charge the resonant capacitor 34. This charging current decreases with time and the voltage of the resonant capacitor 34 increases in a period between the times $t_2$ and $t_3$ and, finally, the charging current decreases to zero and the voltage of the resonant capacitor 34 reaches a peak.

Then, in a period between the times $t_3$ and $t_4$, the charge of the resonant capacitor 34 is discharged through the horizontal deflection coil 35, the voltage of the resonant capacitor 34 decreases gradually, the intensity of the reverse current that flows through the horizontal deflection coil 35 increases, the voltage of the resonant capacitor 34 returns to the initial voltage, and the intensity of the reverse current reaches a peak.

In a period between the times $t_4$ and $t_5$, a current flows through the damping diode 33 owing to the counterelectromotive force of the horizontal deflection coil 35, so that the current continues to flow in the same direction. The intensity of the current decreases gradually to zero at the time $t_5$. In this state, the a positive pulse is applied to the base of the transistor 31 to turn on the transistor 31. Consequently, linearly increasing current flows again through the horizontal deflection coil 35. Thus, the foregoing cycle is repeated and a sawtooth deflection current flows through the horizontal deflection coil 35.

In the horizontal output circuit 24 shown in FIG. 7, power loss occurs in the damping diode 33 because part of the sawtooth deflection current flows through the damping diode 33. If the damping diode 33 is omitted to prevent the power loss, part of the sawtooth deflection current flows through the base-collector diode junction of the transistor 31.

Generally, the current amplification factor ($h_{FE}$ = (Collector current $I_c$)/(Base current $I_B$)< 1) of the transistor 31, i.e., an ordinary transistor, in the reverse region is very small. Therefore, it is very difficult for the transistor 31 to function properly in the reverse region.

The widely used horizontal driving circuit 23 drives the transistor 31 by transformer coupling using a driving transformer. When driving the transistor 31 by transformer coupling, a resistor is inserted between the secondary coil of the driving transformer and the base of the transistor 31 to apply an optimum base current to the base of the transistor 31. In a flat CRT as shown in FIG. 4 that uses a very low horizontal deflection current, a capacitor and a clamping diode are used instead of the driving transformer.

Accordingly, the omission of the damping diode 33 is not desirable from the view point of power loss and the linearity of scanning.

Although a power transistor internally provided with a damping diode may be used instead of the transistor 31 to omit the damping diode 33, such a power transistor still has the problem of power loss caused by the internal damping diode and is more expensive than the transistor 31.

Figure 9:
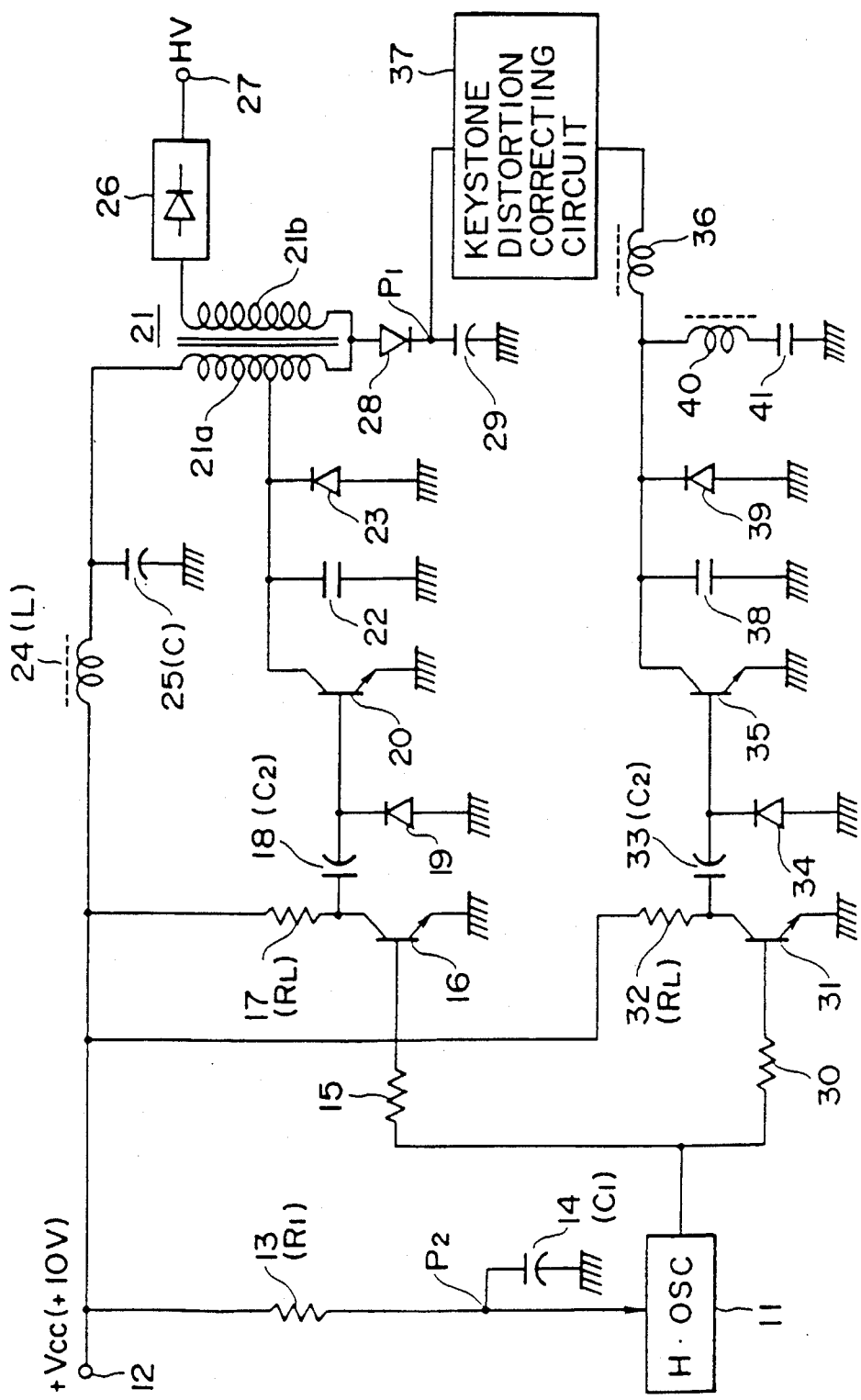
FIG. 9 is a circuit diagram of the horizontal deflection circuit and the high-voltage circuit of a flat CRT.

FIG. 9 shows a circuit of a separate type for a flat CRT, separately having a horizontal deflection circuit and a high-voltage circuit. Referring to FIG. 9, a dc voltage $+V_{cc}$ of, for example, +10 V is applied to a power terminal 12. The power terminal 12 is connected to a ground through a series circuit, which serves as a low-pass filter, consisting of a resistor 13 and a capacitor 14. Junction point $P_2$ of the resistor 13 and the capacitor 14 is connected to a horizontal oscillation circuit 11 to supply power to the horizontal oscillation circuit 11. A horizontal oscillation signal provided by the horizontal oscillation circuit 11 is supplied through a resistor 15 to the base of a high-voltage driving transistor 16 having an emitter connected to the ground and a collector connected through a resistor 17 to the power terminal 12. The junction point of the collector of the driving transistor 16 and the resistor 17 is grounded through a coupling capacitor 18 and a clamping diode 19. The junction point of the capacitor 18 and the clamping diode 19 is connected to the base of a transistor 20. The emitter of the transistor 20 is grounded and the collector of the same is connected to the center tap of the primary coil 21a of a FBT 21. A parallel circuit of a resonant capacitor 22 and a damping diode 23 is connected across the collector of the transistor 20 and the ground. A series circuit consisting of a coil 24 and a capacitor 25 and serving as a low-pass filter is connected across the power terminal 12 and the ground. The junction point of the coil 24 and the capacitor 25 is connected to one end of the primary coil 21a of the FBT 21.

The secondary coil 21b of the FBT 21 has one end connected to a high-voltage rectifier circuit 26. The high-voltage rectifier circuit 26 rectifies a voltage pulse signal that appears at one end of the secondary coil 21b and applies a high voltage HV to a terminal 27. The respective other ends of the primary coil 21a and the secondary coil 21b of the FBT 21 are connected to each other at a junction point $P_1$ connected to the ground by a smoothing circuit consisting of a diode 28 and a capacitor 29.

A horizontal oscillation signal provided by the horizontal oscillation circuit 11 is given through a resistor 30 to the base of a horizontal driving transistor 31 having an emitter connected to the ground and a collector connected through a resistor 32 to the power terminal 12. The junction point of the collector of the transistor 32 and the resistor 32 is grounded through a coupling capacitor 33 and a clamping diode 34. The junction point of the coupling capacitor 33 and the clamping diode 34 is connected to the base of a horizontal output transistor 35.

The emitter of the transistor 35 is grounded and the collector of the same is connected through a choke coil 36 and a keystone distortion correction circuit 37 to the junction point $P_1$ of the diode 28 and the capacitor 29. The keystone distortion correction circuit 37 modulates the voltage that appears at the junction point $P_1$ by a sawtooth signal to correct keystone distortion. A parallel circuit of a resonant capacitor 38, a damping diode 39, and a series circuit of a horizontal deflection coil 40 and an S-shape distortion correction capacitor 41 are connected across the collector of the transistor 35 and the ground.

Since the flat CRT needs comparatively small deflection power, the horizontal driving transistor 31 loaded with the resistor 32 is able to drive the horizontal output transistor 35. For example, for a 4 in. flat CRT, the collector current of the transistor 35 is in the range of 0.7 to 1 A (peak-to-peak). Accordingly, the base current of the transistor 35 is only 15 mA if the current amplification factor $h_{FE}$ of the transistor 35 meets an inequality: $h_{FE} \geq 100$. Therefore, when the resistance of the resistor 32 is 1.5 kΩ, the base of the transistor 35 can be coupled with the junction point of the collector of the transistor 31 and the resistor 32 by the coupling capacitor 33.

Generally, the horizontal oscillation circuit 11 is a VCO (voltage-controlled oscillator). The VCO is highly sensitive to control signals and is liable to be caused to malfunction by noise, particularly by supply voltage noise. For example, when the ambient temperature is on the order of −10° C. the capacitances of electrolytic capacitors included in the high-voltage circuit and the main power supply decreases sharply, whereupon the source impedance increases. Consequently, the VCO malfunctions and there is a change to change the oscillation frequency caused by pulse noise generated by the high-voltage circuit and transmitted through the power supply line. Then, an AFC circuit, not shown, operates to control the oscillation frequency to cause picture noise that can cause the upper portions of vertical lines to meander. The low-pass filter consisting of the resistor 13 and the capacitor 14 is inserted in the power supply line of the horizontal oscillation circuit 11 to prevent the response of the VCO to the pulse noise.

When the low-pass filter is inserted in the power supply line of the horizontal oscillation circuit 11, the rise of the supply voltage for the horizontal oscillation circuit 11 is delayed behind the rise of the supply voltage for the driving circuit and the output circuit, so that the horizontal oscillation circuit starts operating after the start of operation of the driving circuit and the output circuit and, in the worst case, the fuse of the power circuit is blown; that is, since the transistors 16 and 31 remain in the off-state and the transistors 20 and 35 remain in the on-state until the horizontal oscillation circuit 11 starts its operation, an excessive current flows through the power line to blow the fuse.

To prevent such malfunction, the time constant required for the rise of power supplied to the driving circuit must be greater than the time constant $R_L.C_2$ required for the rise of power supplied to the horizontal oscillation circuit 11. For example, the time constants are determined so as to meet an inequality:

$$R_1.C_1 \leq R_L.C_2 + L.C$$

where $R_L.C_2$ is the time constant of the driving circuit, and L.C is the time constant of the high-voltage circuit.

However, in some cases, an increase of the time constants of the horizontal deflection circuit and the driving circuit for driving the high-voltage circuit adversely affects the transient response characteristics (switching characteristics) of the transistors 20 and 35.

A horizontal deflection circuit in a first embodiment according to the present invention will be described hereinafter with reference to FIG. 10.

Figure 10:
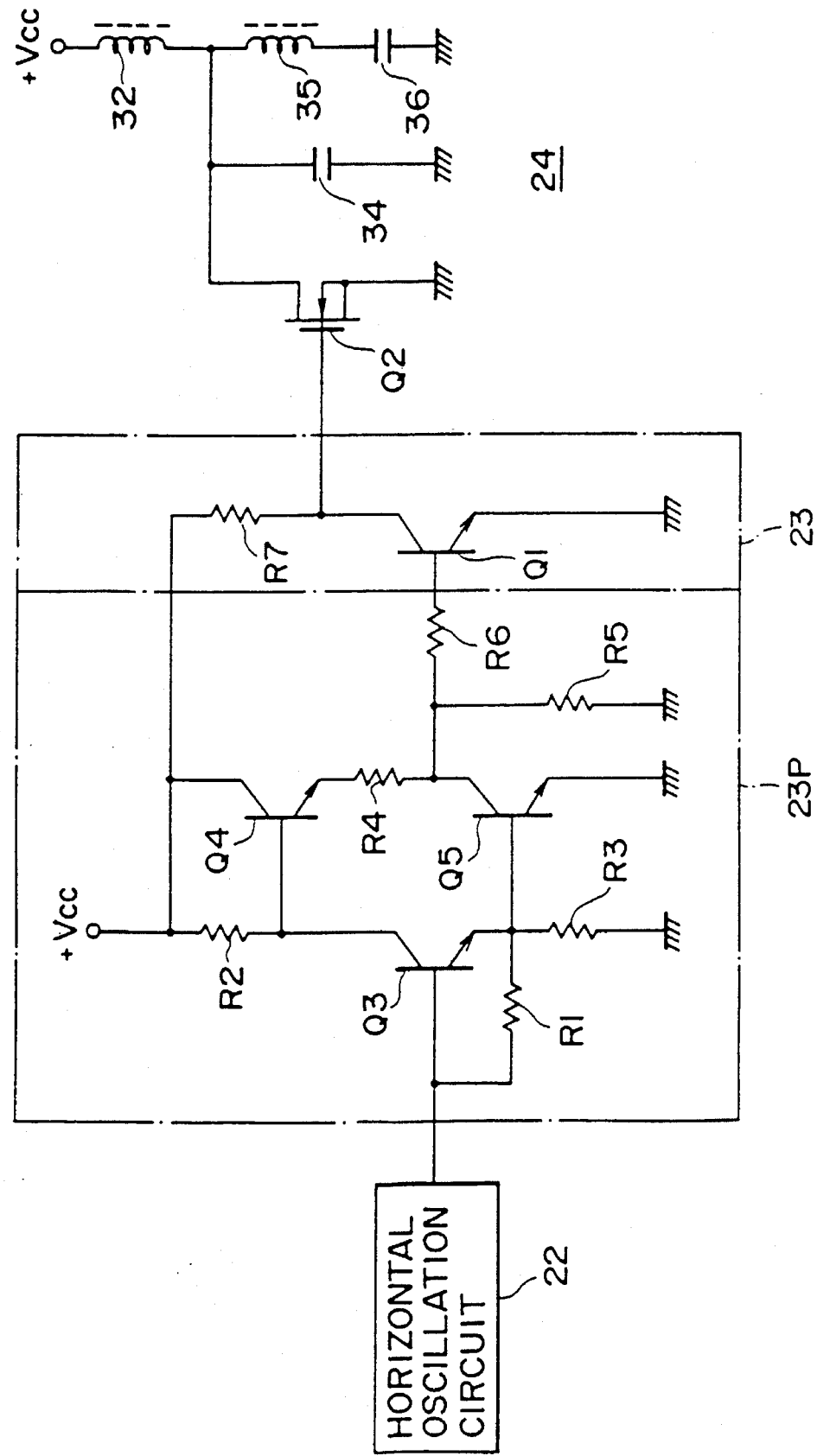
FIG. 10 is a circuit diagram of a horizontal deflection circuit in a first embodiment according to the present invention.

Referring to FIG. 10, a horizontal oscillation output provided by a horizontal oscillation circuit 22 is applied to the base of an npn transistor Q3 included in a horizontal predriving circuit 23P. A resistor R1 is connected across the base of the transistor Q3 and the emitter of the same transistor Q3. A resistor R2 is connected across the collector of the transistor Q3 and a power terminal $+V_{cc}$, and a resistor R3 is connected across the emitter of the same and a ground. The junction point of the collector of the transistor Q3 and the resistor R2 is connected to the base of an npn transistor Q4. The transistor Q4 has a collector connected to the power terminal $+V_{cc}$ and an emitter connected through a resistor R4 to the collector of an npn transistor Q5. The junction point of the emitter of the transistor Q3 and the resistor R3 is connected to the base of the transistor Q5, and the emitter of the transistor Q5 is grounded. A resistor R5 is connected across the junction point of the collector of the transistor Q5 and the resistor R4 and the ground, and a resistor R6 is connected across the junction point and the base of an npn transistor Q1 included in a horizontal driving circuit 23 and serving as a switching element. The emitter of the transistor Q1 is grounded and the collector of the same is connected through a resistor R7 to the power terminal $+V_{cc}$. The junction point of the collector of the transistor Q1 and the resistor R7 is connected to the gate of an n-channel enhancement MOSFET (metal-oxide-semiconductor field-effect transistor) Q2 included in a horizontal output circuit 24. The source of the MOSFET Q2 is grounded and the drain of the same is connected through the primary coil 32 of a FBT to the power terminal $+V_{cc}$. A parallel circuit consisting of a resonant capacitor 34 and a series circuit of a horizontal deflection coil 35 and an S-shape distortion correcting capacitor 36 is connected across the drain of the MOSFET Q2 and the ground.

Figure 11:
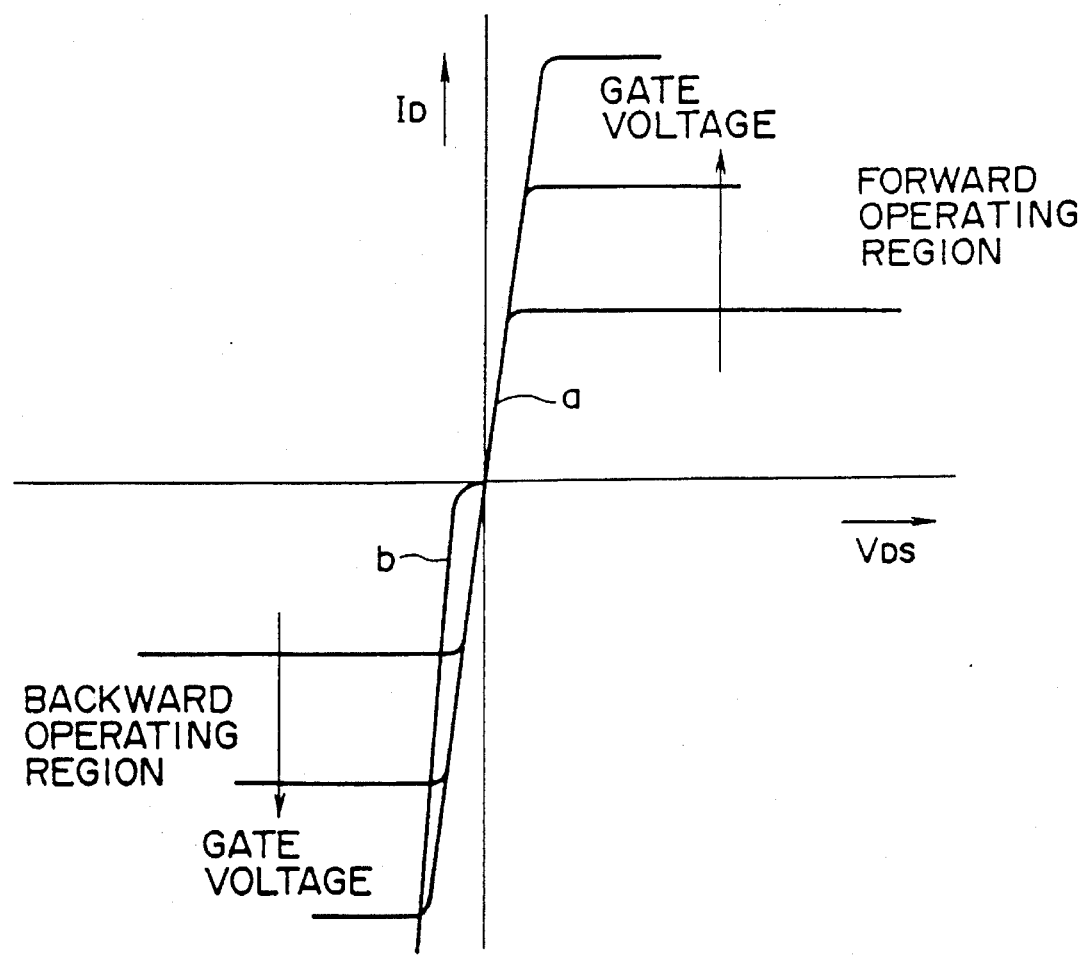
FIG. 11 is a graph showing the characteristics of a MOSFET (metal-oxide-semiconductor field effect transistor)

FIG. 11 shows the characteristics of the MOSFET Q2, in which the drain-source voltage $V_{DS}$ is measured on the horizontal axis and the drain current $I_D$ is measured on the vertical axis. In FIG. 11, a curve a represents the relation between the source-drain voltage $V_{DS}$ and the drain current $I_D$ when the MOSFET Q2 is turned on (on-characteristics) and a curve b represents the relation between the drain-source voltage $V_{DS}$ and the drain current $I_D$ when the MOSFET Q2 is turned off (diode characteristics).

Figures 12A, 12B, 12C, 12D, 12E, 12F, 12G:
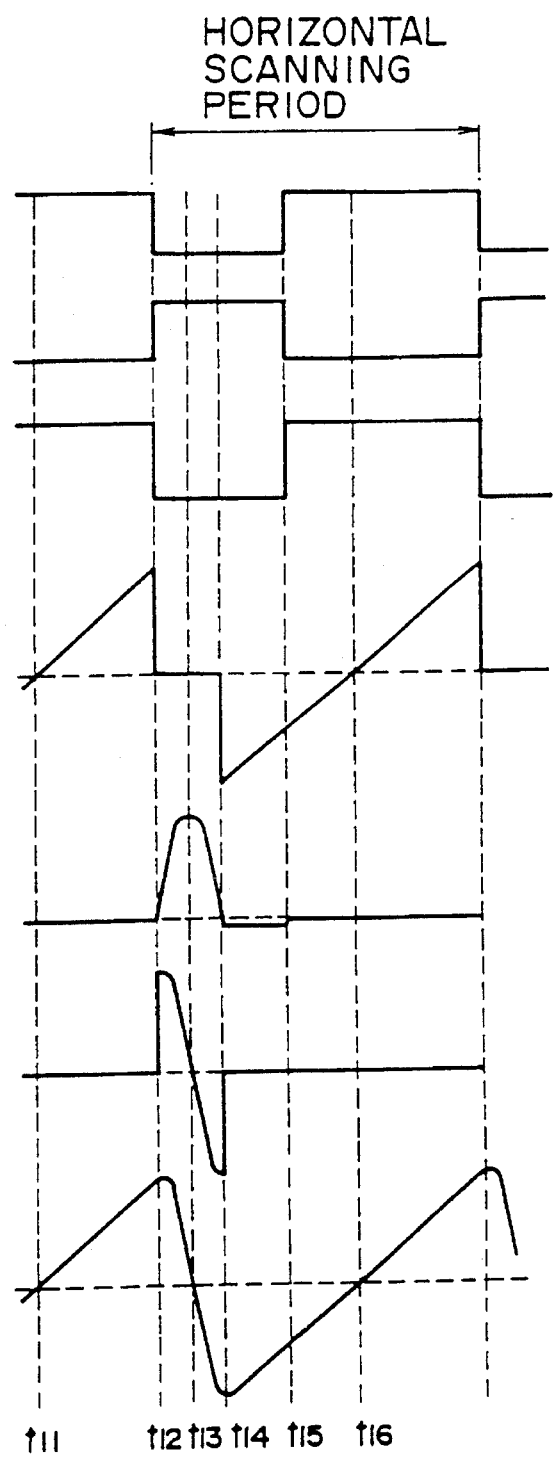
FIGS. 12A, 12B, 12C, 12D, 12E, 12F and 12G are diagrams respectively showing the waveforms of an oscillation output, a predrive output, a horizontal driving pulse signal, a drain current, a drain voltage, a resonant capacitor current and a deflection current that appear in the horizontal deflection circuit of FIG. 10.

The operation of the horizontal deflection circuit will be described hereinafter with reference to FIGS. 12A to 12G. Suppose that the horizontal oscillation circuit 22 gives a pulse signal as shown in FIG. 12A to the predriving circuit 23P. When the output pulse signal of the horizontal oscillation circuit 22 is LOW, the transistors Q3 and Q5 are turned OFF, the transistor Q4 is turned ON and the output signal of the predriving circuit 23P goes HIGH. When the output pulse signal of the horizontal oscillation circuit 22 is HIGH, the transistors Q3 and Q5 are turned ON, the transistor Q4 is turned OFF and the output signal of the predriving circuit 23P goes LOW (FIG. 12B). When the output signal of the predriving circuit 23P is HIGH, the transistor Q1 is turned ON and the output signal of the driving circuit 23, i.e., the horizontal driving pulse signal applied to the gate of the MOSFET Q2, goes LOW. When the output signal of the predriving circuit 23P is LOW, the transistor Q1 is turned OFF and the horizontal driving pulse signal goes HIGH (FIG. 12C).

When the horizontal oscillation circuit 22 provides the pulse signal as shown in FIG. 12A, the predriving circuit 23P provides an output signal shown in FIG. 12B and the driving circuit 23 provides a horizontal driving pulse signal shown in FIG. 12C. The MOSFET Q2 is turned OFF when the transistor Q1 is turned ON and the horizontal driving pulse signal is LOW, and the MOSFET Q2 is turned ON when the transistor Q1 is turned OFF and the horizontal driving pulse signal is HIGH. Thus, the transistors Q1 and Q2 are complementary to each other. Naturally, the transistors Q2, Q3 and Q5 are in the OFF state and the transistors Q4 and Q1 are in the ON state when the horizontal oscillation circuit 22 is stopped, so that the destruction of the circuit which occurs when the MOSFET Q2 is held in the ON state can be prevented.

The operation of the horizontal output circuit 24 will be described hereinafter. When a horizontal driving pulse signal shown in FIG. 12C is applied to the gate of the MOSFET Q2, a sawtooth deflection current shown in FIG. 12G flows through the deflection coil 35; that is, when a positive pulse is applied to the base of the MOSFET Q2, the MOSFET Q2 is turned ON and a current linearly increasing with time flows through the deflection coil 35 in a period between the times $t_{11}$ and $t_{12}$. When a negative pulse is applied to the gate of the MOSFET Q2, the current is caused to continue flowing in the same direction by inductance inertia to charge the resonant capacitor 34. In a period between the times $t_{12}$ and $t_{13}$, this charging current decreases with time and the voltage of the resonant capacitor 34 increases. Finally, the charging current decreases to zero and the voltage of the resonant capacitor 34 (drain voltage) reaches a peak.

Then, in a period between the times $t_{13}$ and $t_{14}$, the resonant capacitor 34 discharges through the deflection coil 35, the voltage of the resonant capacitor 34 decreases gradually, the reverse deflection current flowing through the deflection coil 35 increases and, finally, the voltage of the resonant capacitor 34 returns to the initial voltage and the reverse deflection current reaches a peak.

Then, in a period between the times $t_{14}$ and $t_{15}$, the MOSFET Q2 becomes conductive as a diode (the diode characteristic curve b in FIG. 11) and the reverse deflection current continues to flow in the same direction and decreases gradually. When a positive pulse is applied to the gate of the MOSFET Q2 to turn ON the MOSFET Q2, the transistor current varies along the on-characteristic curve a (FIG. 11), the reverse deflection current continues to flow in the same direction and decreases gradually to zero in a period between the times $t_{15}$ and $t_{16}$.

Since the MOSFET Q2 is in the ON state, a current linearly increasing with time flows again through the deflection coil 35. Thus, the foregoing cycle is repeated to supply the sawtooth current to the deflection coil 35.

Since the horizontal output circuit 24 of the horizontal deflection circuit in this embodiment is provided with the MOSFET Q2 as a switching element and not provided with any damping diode, loss of power attributable to a damping diode is prevented and hence power loss in the horizontal deflection circuit is comparatively small.

Since the output side of the horizontal oscillation circuit 22 is connected through the predriving circuit 23P to the base of the transistor Q1 of the driving circuit 23, and the collector of the transistor Q1 at which the horizontal driving pulse signal appears is connected directly to the gate of the MOSFET Q2 of the horizontal output circuit 24, the output signal of the horizontal oscillation circuit 22 is transferred with complete fidelity and without being distorted, so that the MOSFET Q2 is able to operate at a high switching speed.

Although not mentioned above, there is no problem in withstand voltage because the maximum drain-source voltage of the MOSFET Q2 of the horizontal output circuit 24 is in the range of about 100 to about 150 V when the horizontal deflection circuit is used in combination with a flat CRT.

Although the drain of the MOSFET Q2 is connected through the primary coil 32 of the FBT to the power terminal $+V_{cc}$ in this embodiment, naturally, the drain of the MOSFET Q2 may be connected through a choke coil to the power terminal $+V_{cc}$.

Since the horizontal output circuit of the horizontal deflection circuit, according to the present invention, is provided with the MOSFET as a switching element to supply the current, which flows through a damping diode in the conventional horizontal deflection circuit, through the MOSFET to eliminate the damping diode, power loss in the horizontal deflection circuit is comparatively small.

Since the output side of the horizontal oscillation circuit is connected through the predriving circuit to the switching element of the driving circuit, and the output side of the switching element is connected directly to the MOSFET of the horizontal output circuit, the output signal of the horizontal oscillation circuit can be transferred with fidelity without being distorted to the MOSFET, so that the switching speed of the MOSFET can be enhanced.

Figure 13:
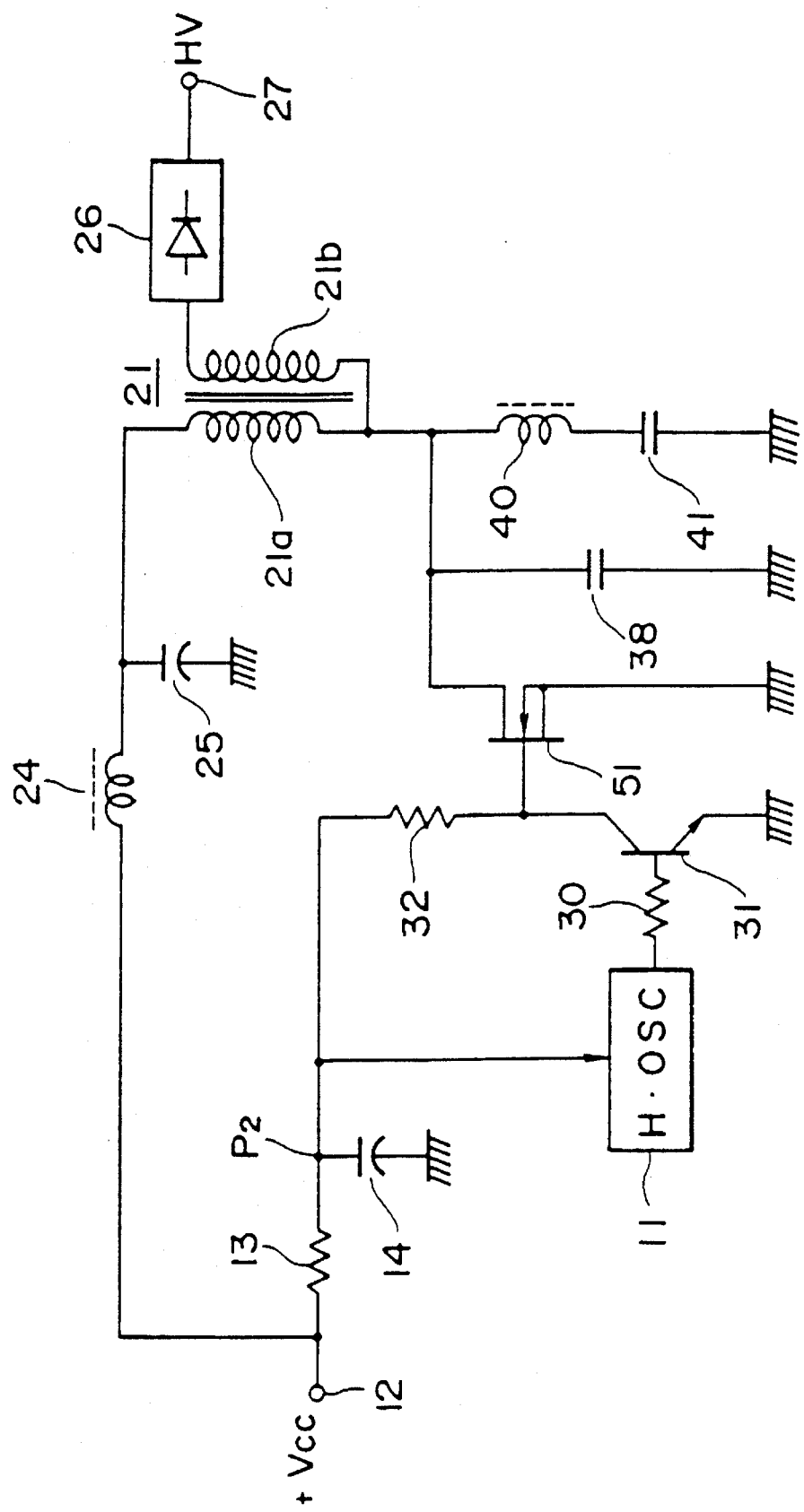
FIG. 13 is a circuit diagram of a horizontal driving circuit in accordance with the present invention.

Referring to FIG. 13, a horizontal driving circuit has a horizontal driving transistor 31 having a collector connected through a resistor 32 to a junction point $P_2$, and power is supplied to both the horizontal driving circuit and a horizontal oscillation circuit 11 by a single power supply. Therefore, the supply voltage applied to the horizontal driving circuit will not rise before the rise of the supply voltage applied to the horizontal oscillation circuit 11 even if a low-pass filter consisting of a resistor 13 and a capacitor 14 is inserted in a power line connected to the horizontal oscillation circuit 11 to remove pulse noise and, consequently, an excessive current that will blow the fuse of the power circuit will not flow through the horizontal output circuit and the reliability of the circuit is enhanced. The driving circuit of the horizontal output circuit need not have as large a time constant as that of the driving circuit of the conventional horizontal output circuit to prevent malfunction, so that the stability of pictures will not be reduced.

Referring to FIG. 13, the output horizontal oscillation signal of the horizontal oscillation circuit 11 is applied through a resistor 30 to the base of the horizontal driving transistor 31. The emitter of the transistor 31 is grounded and the collector of the same is connected through the resistor 32 to the junction point $P_2$ of the resistor 13 and the capacitor 14 constituting the low-pass filter. The junction point of the collector of the transistor 31 and the resistor 32 is connected to the gate of an n-channel enhancement MOSFET 51. The source of the MOSFET 51 is grounded and the drain of the same is connected to one end of the primary coil 21a of a FBT 21. A parallel circuit of a resonant capacitor 38 and a series circuit consisting of a horizontal deflection coil 40 and an S-shape distortion correcting capacitor 41 is connected across the drain of the MOSFET 51 and the ground.

As shown in FIG. 13, since the collector of the transistor 31 included in the horizontal driving circuit is connected through the resistor 32 to the junction point $P_2$, and the power supply is connected to both the horizontal driving circuit and the horizontal oscillation circuit 11, the supply voltage applied to the horizontal driving circuit does not rise before the rise of the supply voltage applied to the horizontal oscillation circuit 11 even if the low-pass filter consisting of the resistor 13 and the capacitor 14 is inserted in the power line connected to the horizontal oscillation circuit 11, so that the flow of an excessive current which will blow the fuse of the power circuit, will not flow through the horizontal output circuit and the reliability of the horizontal deflection circuit can be enhanced. Since the time constant of the driving circuit of the horizontal output circuit need not be very large to prevent malfunction, the stability of pictures will not be reduced.

A horizontal deflection circuit in a second embodiment according to the present invention will be described hereinafter with reference to FIG. 14. This horizontal deflection circuit is of the separate type separated from a high-voltage circuit.

Figure 14:
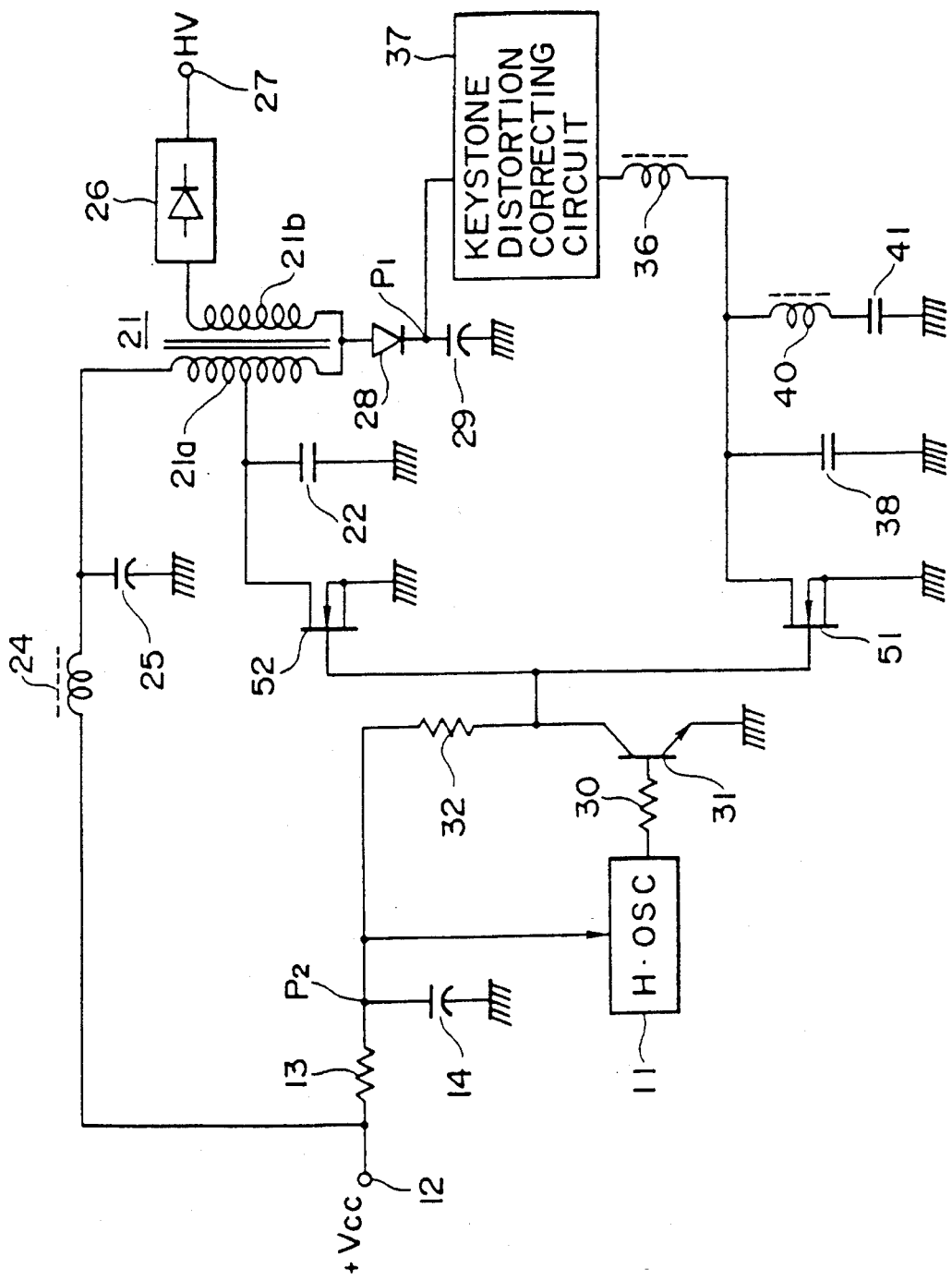
FIG. 14 is a circuit diagram of a horizontal deflection circuit in a second embodiment according to the present invention.

Referring to FIG. 14, the drain of a MOSFET 51 serving as a horizontal output transistor is connected through a choke coil 36 and a keystone distortion correcting circuit 37 to a junction point $P_1$. The gate of an enhancement MOSFET 52 is connected to the junction point of the collector of a transistor 31 and a resistor 32. The source of the MOSFET 52 is grounded and the drain of the same is connected to the center tap of the primary coil 21a of a FBT 21. A resonant capacitor 22 is connected across the drain of the MOSFET 52 and the ground. The mode of operation of a horizontal output circuit provided with the MOSFET 52 serving as a high-voltage output transistor is the same as that of the horizontal output circuit of the horizontal deflection circuit in the first embodiment. Since the horizontal output circuit need not be provided with any damping diode that entails power loss, power loss in the high-voltage circuit is comparatively small. Since the MOSFET 52 can be controlled simply by controlling the voltage to be applied to the gate of the MOSFET 52, a horizontal driving circuit having a very simple configuration may be employed. Since the load resistance may be large, power loss is small. Accordingly, both the MOSFETs 51 and 52 can be controlled only by the transistor 31.

Since the collector of the transistor 31 for driving both the horizontal driving circuit and the high-voltage circuit is connected through the resistor 32 to a junction point $P_2$ and a single power supply supplies power to both the driving circuit and a horizontal oscillation circuit, the supply voltage applied to the driving circuit will not rise before the rise of the supply voltage applied to the horizontal oscillation circuit 11 even if a low-pass filter consisting of a resistor 13 and a capacitor 14 is inserted in a power line connected to the horizontal oscillation circuit 11, so that the flow of an excessive current, which will blow the fuse of the power circuit, will not flow through the horizontal output circuit and the high-voltage output circuit can be prevented and the reliability of the circuit can be enhanced. The respective time constants of the horizontal output circuit, and the driving circuit of the high-voltage output circuit need not be as large as those of the horizontal output circuit, and the driving circuit of the high-voltage output circuit of the conventional horizontal deflection circuit to prevent malfunction, so that the stability of pictures will not be reduced.

A horizontal deflection circuit in a third embodiment according to the present invention will be described hereinafter with reference to FIG. 15.

Figure 15:
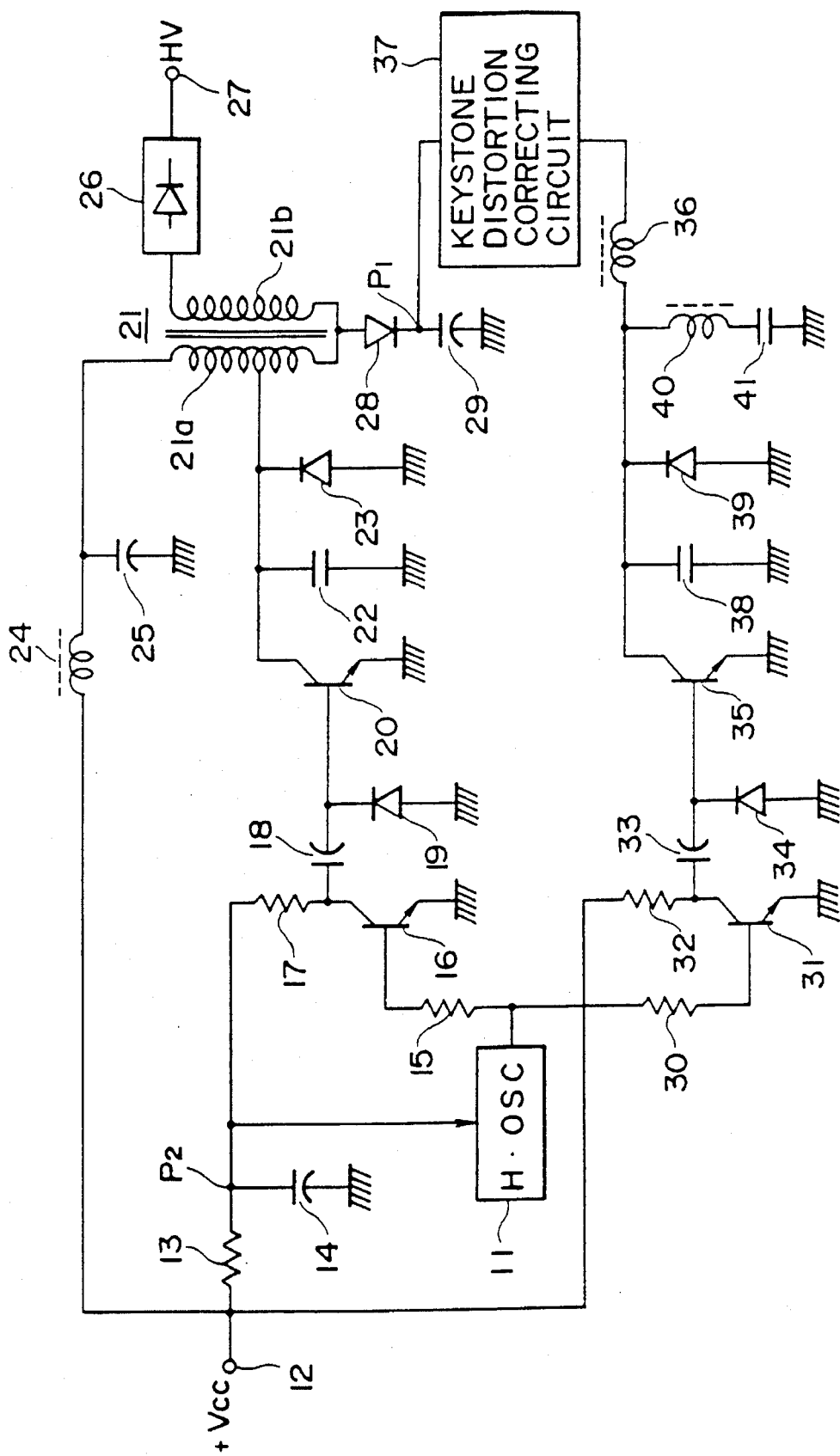
FIG. 15 is a circuit diagram of a horizontal deflection circuit in a third embodiment according to the present invention.

Referring to FIG. 15, the collector of a transistor 16 included in the driving circuit of a high-voltage circuit is connected through a resistor 17 to a junction point $P_2$ and a single power supply supplies power to both the high-voltage driving circuit and a horizontal oscillation circuit 11. Therefore, the supply voltage applied to the high-voltage driving circuit will not rise before the rise of the supply voltage applied to the horizontal oscillation circuit 11, even if a low-pass filter consisting of a resistor 13 and a capacitor 14 is inserted in the power line connected to the horizontal oscillation circuit 11 to eliminate pulse noise, so that the flow of an excessive current which will blow the fuse of a power supply circuit, will not flow through the high-voltage driving circuit due to a malfunction and the reliability of the horizontal deflection circuit can be enhanced.

Since power is supplied from the high-voltage circuit through a keystone distortion correcting circuit 37 to a horizontal output circuit, the horizontal output circuit will not operate before the horizontal oscillation circuit 11 operates, so that any excessive current due to malfunction will not flow through the horizontal output circuit. Furthermore, the respective time constants of the horizontal output circuit, and the driving circuit of the high-voltage output circuit need not be as large as those of the horizontal output circuit and the driving circuit of the conventional horizontal deflection circuit to prevent malfunction, so that the stability of pictures will not be reduced.

Since the single power supply supplies power to both the horizontal driving circuit and the horizontal oscillation circuit, the supply voltage applied to the horizontal driving circuit will not rise before the rise of the supply voltage applied to the horizontal oscillation circuit even if a low-pass filter is inserted in the power line connected to the horizontal oscillation circuit, so that the flow of an excessive current which will blow the fuse of the power supply circuit, will not flow through the horizontal output circuit due to a malfunction and the reliability of the horizontal deflection circuit can be enhanced. Since the time constant of the driving circuit of the horizontal output circuit need not be large to prevent malfunction, the stability of pictures will not be reduced.

Since the single power supply supplies power to both the driving circuit for driving the high-voltage output circuit, and the horizontal oscillation circuit, the supply voltages applied to the high-voltage output circuit and the horizontal output circuit will not rise before the rise of the supply voltage applied to the horizontal oscillation circuit even if a low-pass filter is inserted in the power line connected to the horizontal oscillation circuit, so that the flow of an excessive current which will blow the fuse of the power supply circuit, will not flow through the high-voltage circuit and the horizontal output circuit and the reliability of the horizontal deflection circuit can be enhanced. Since the respective time constants of the horizontal output circuit, and the driving circuit of the high-voltage output circuit need not be very large to prevent malfunction, the stability of pictures will not be reduced.

A horizontal deflection circuit in a fourth embodiment according to the present invention will be described hereinafter with reference to FIG. 16.

Figure 16:
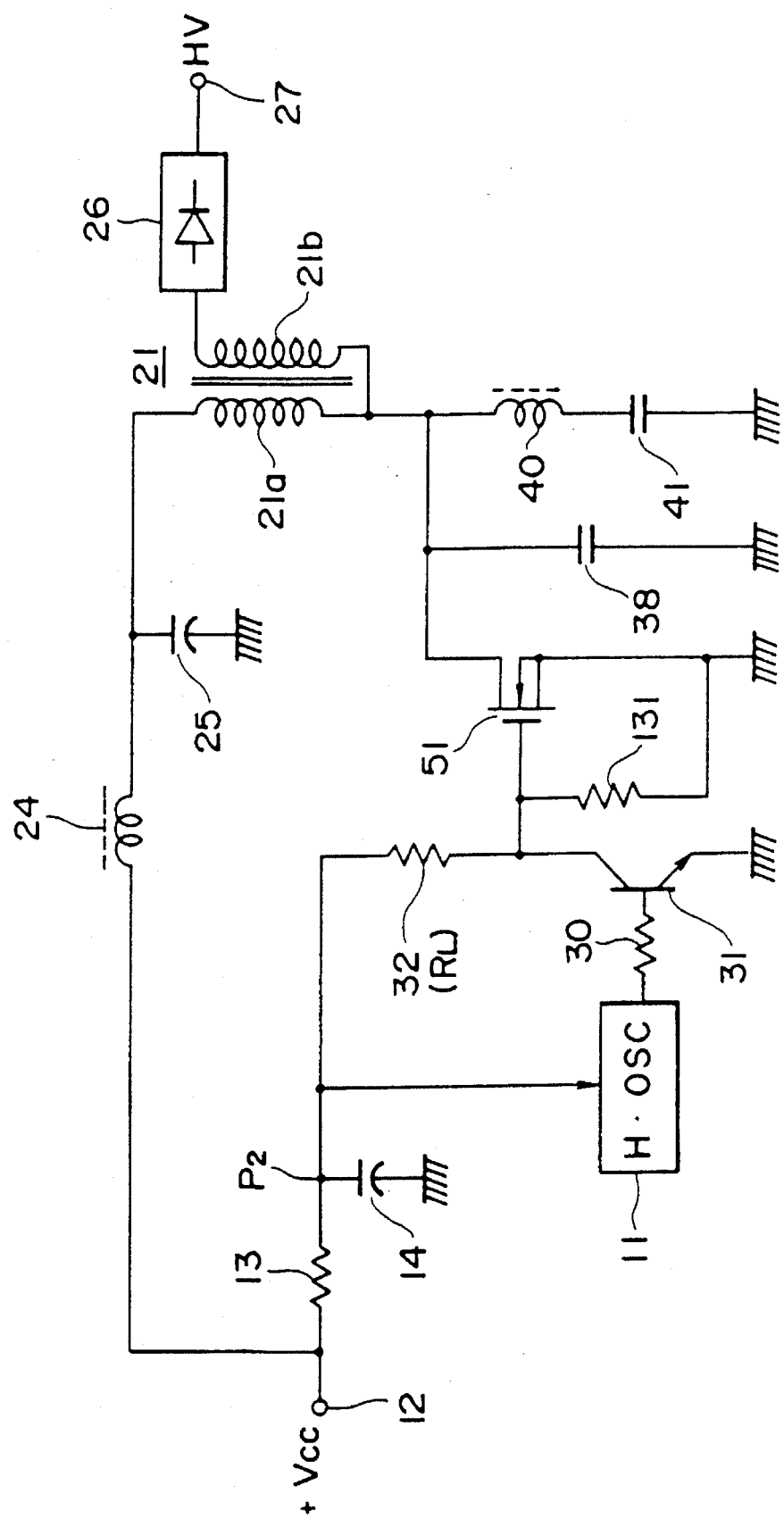
FIG. 16 is a circuit diagram of a horizontal deflection circuit in a fourth embodiment according to the present invention.

Referring to FIG. 16, a resistor 131 is connected across the gate and the source of a MOSFET 51 serving as a horizontal output transistor. The resistance R of the resistor 131 is determined so that a voltage that appears at the junction point of a resistor 32 and the resistor 131, i.e., the gate voltage $V_G$ of the MOSFET 51, when a voltage $V_1$ that appears at a junction point $P_2$ is equal to the oscillation start voltage $V_{osc}$ of a horizontal oscillation circuit 11 is lower than the gate threshold voltage $V_{TH}$ in the range of about 2.5 to about 4.5 V of the MOSFET 51. For example, when the oscillation start voltage $V_{osc}$ of the horizontal oscillation circuit 11 is 3 V and the resistance $R_L$ of the resistor 32 is 2.7 kΩ, the resistance R of the resistor 131 is 6.8 kΩ. The gate voltage $V_G$ is expressed by expression (1).

$$V_G = R \cdot V_{osc}/(R+R_L) \quad (1)$$

When $V_{osc} = 3$ V, $R = 6.8$ kΩ and $R_L = 2.7$ kΩ, $V_G = 3 \times 6.8/(6.8+2.7) \approx 2.15$ V Since the resistor 131 is connected across the gate and the source of the MOSFET 51 serving as a horizontal output transistor, the gate voltage $V_G$ of the MOSFET 51 is held below the gate threshold voltage $V_{TH}$ of the MOSFET 51 until the voltage $V_1$ at the junction point $P_2$ reaches the oscillation start voltage $V_{osc}$ and the horizontal oscillation circuit 11 starts its operation after the connection of the horizontal oscillation circuit 11 to the power supply. Accordingly, MOSFET 51 is never turned on before the horizontal oscillation circuit 11 starts its operation, the flow of an excessive current which will blow the fuse of a power supply circuit, will not flow through the horizontal output circuit and the reliability of the horizontal deflection circuit can be enhanced.

The time constant of the horizontal driving circuit need not be as large as that of the horizontal driving circuit of the conventional horizontal deflection circuit to prevent the MOSFET 51 from being turned on before the horizontal oscillation circuit 11 starts its operation, so that the transient response characteristics (switching characteristics) of the horizontal output circuit are not deteriorated and the stability of pictures will not be reduced.

Since the selection of a MOSFET having a gate threshold voltage $V_{TH}$ higher than the oscillation start voltage $V_{osc}$ of the horizontal oscillation circuit 11, for use as the MOSFET 51 is unnecessary, MOSFET selecting work is unnecessary and the inconvenience that only MOSFETs meeting particular conditions are applicable can be avoided.

Since the resistor 131 is connected across the gate and the source of the MOSFET 51, the impedance between the gate and the source of the MOSFET 51 is small, so that the MOSFET 51 will not be turned on even if pulse noise generated by the discharge of the associated CRT is applied to the gate of the MOSFET 51 and the pulse noise will not be displayed.

A horizontal deflection circuit in a fifth embodiment according to the present invention will be described hereinafter with reference to FIG. 17.

Figure 17:
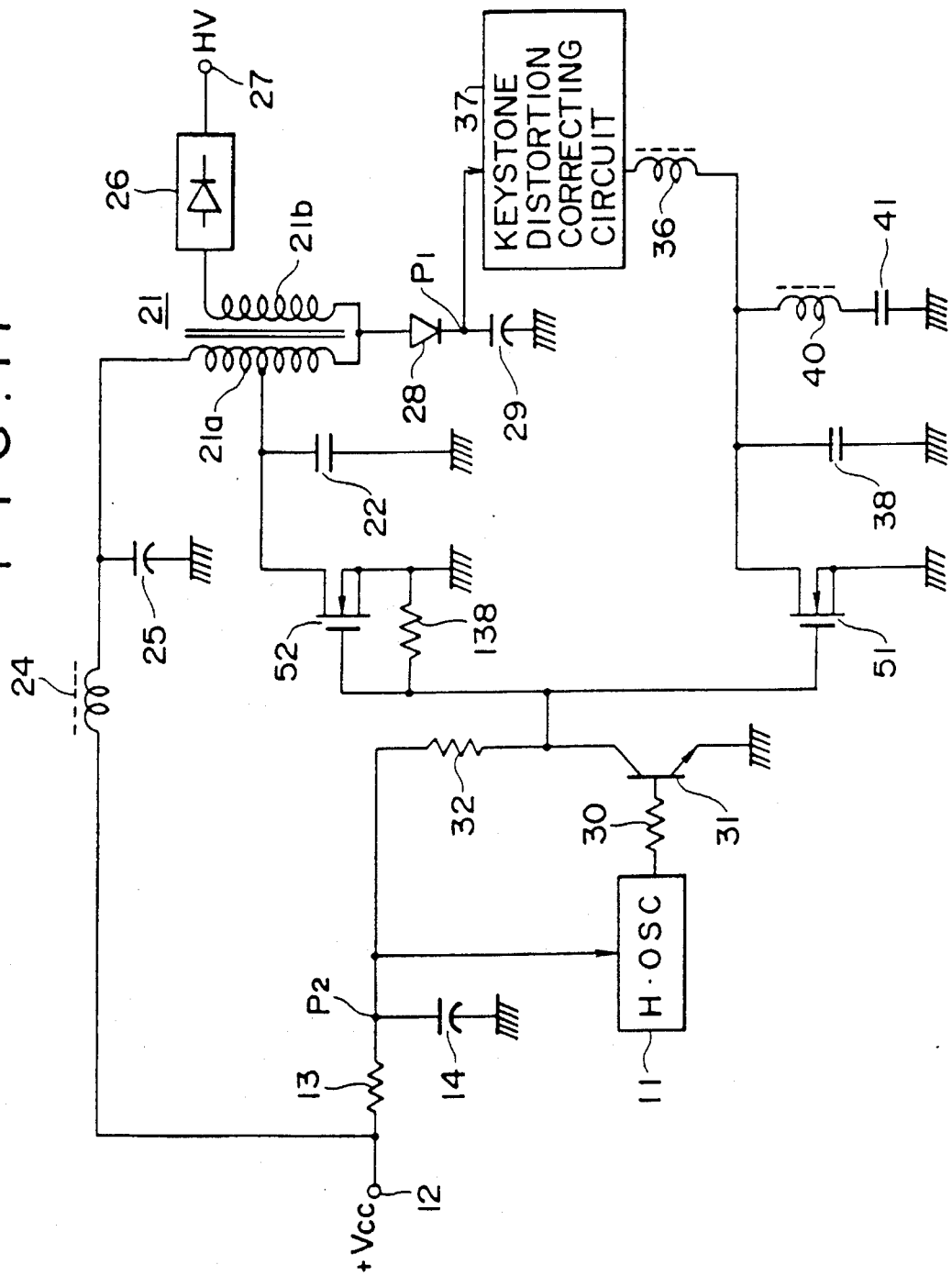
FIG. 17 is a circuit diagram of a horizontal deflection circuit in a fifth embodiment according to the present invention.

Referring to FIG. 17, a resistor 138 is connected across the gate and the source of a MOSFET 52 serving as a high-voltage output transistor. After the horizontal deflection circuit has been connected to the power supply, the gate voltage of the MOSFET 52 is held below a gate threshold voltage $V_{TH}$ until the voltage $V_1$ at a junction $P_1$ reaches an oscillation start voltage $V_{osc}$ and a horizontal oscillation circuit 11 starts its operation. Therefore, the MOSFET 52 will not be turned on before the horizontal oscillation circuit 11 starts its operation, so that the flow of an excessive current which will blow the fuse of a power supply circuit, and will not flow through the high-voltage circuit and the reliability of the horizontal deflection circuit can be enhanced.

Since the time constant of a horizontal driving circuit need not be very large to prevent the MOSFET 52 from being turned on before the horizontal oscillation circuit 11 starts its operation, the transient response characteristics (switching characteristics) of a horizontal output circuit do not deteriorate and the stability of the pictures will not be reduced.

Since the resistor 138 is connected also across the gate and the source of a MOSFET 51, the impedance between the gate and the source of the MOSFET 51 is small, the MOSFET 51 will not be turned on even if pulse noise generated by the discharge of the associated CRT is applied to the gate of the MOSFET 51 and the pulse noise will not be displayed.

A horizontal deflection circuit in a sixth embodiment according to the present invention will be described hereinafter with reference to FIG. 18.

Figure 18:
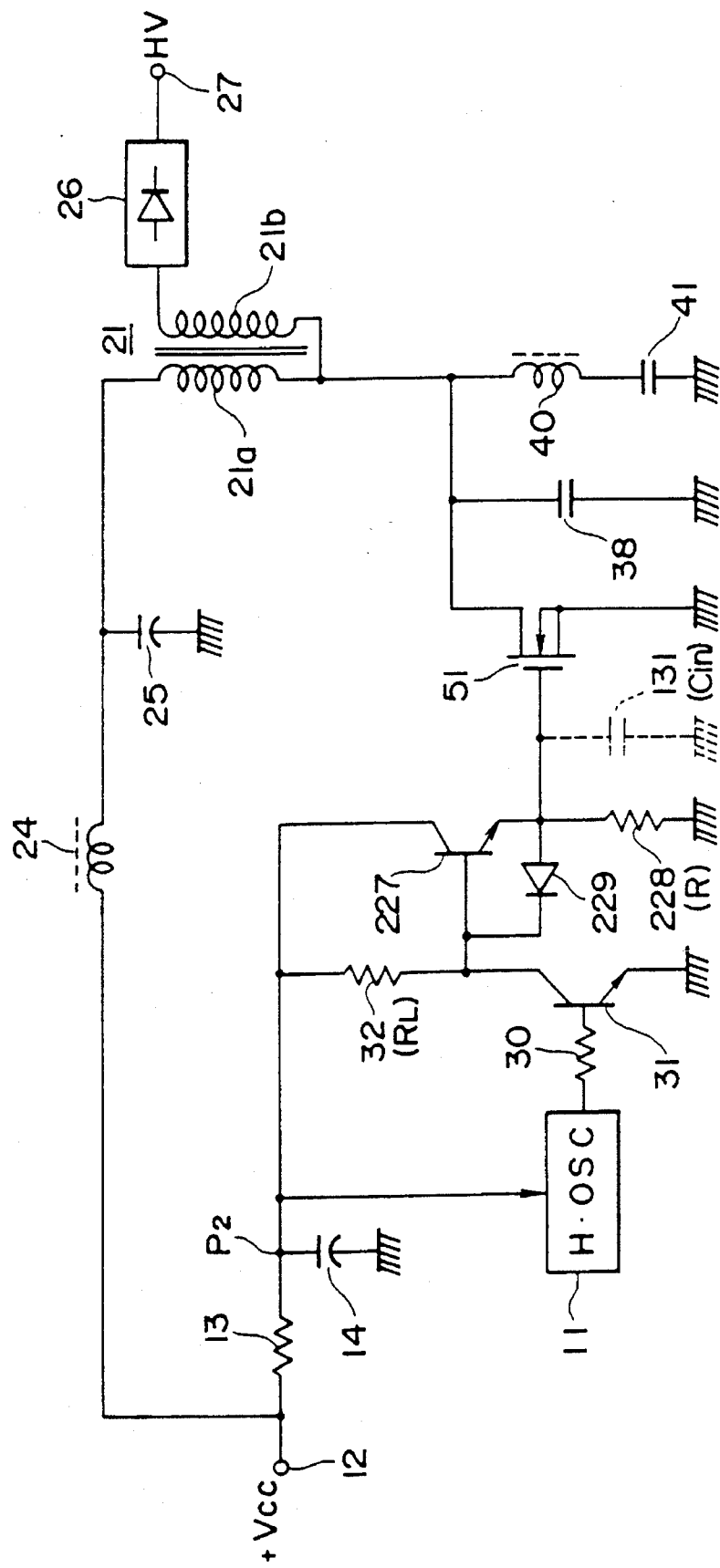
FIG. 18 is a circuit diagram of a horizontal deflection circuit in a sixth embodiment according to the present invention.

Referring to FIG. 18, the junction point of the collector of a horizontal driving transistor 31 and a resistor 32 is connected to the base of an npn transistor 227 included in an emitter follower circuit serving as an impedance varying means. A resistor 228 is connected across the emitter of the transistor 227 and a ground, and the collector of the transistor 227 is connected to the junction point $P_2$ of a resistor 13 and a capacitor 14. A diode 229 is connected across the emitter and the base of the transistor 227. The junction of the emitter of the transistor 227 and the resistor 228 is connected to the gate of a MOSFET 51.

Since a horizontal driving circuit is provided on its output side with the emitter follower circuit including the transistor 227, the horizontal driving circuit drives the MOSFET 51 with a low impedance. Therefore, the sharpness of the waveform of the horizontal driving pulse signal is not reduced even if a capacitor/31 is connected across the gate and the source of the MOSFET 51. When the horizontal driving transistor 31 is turned off, the transistor 227 is turned on and power is supplied through the collector and the emitter of the transistor 227 to charge the capacitor/31 and, consequently, a horizontal driving pulse applied to the gate of the MOSFET 51 rises immediately. Therefore, the MOSFET 51 is turned on immediately at an on-time ten without delay, and the operation for horizontal deflection is not affected adversely by delay in turning on the MOSFET 51.

Electric charge stored in the capacitor 31 while the transistor/31 is in the OFF state, i.e., while the transistor 227 and the MOSFET 51 are in the ON state, is discharged immediately through the diode 229, and the collector and the emitter of the transistor 31 when the transistor 31 is turned on, i.e., when the transistor 227 is turned off. Consequently, a horizontal driving pulse applied to the gate of the MOSFET 51 falls immediately and the MOSFET 51 is turned off immediately. Thus, the diode 229 enhances the switching speed of the MOSFET 51.

Since the resistance $R_L$ of the load resistor 32 and the resistance R of the resistor 228 of the horizontal driving circuit may be large, power loss in the horizontal driving circuit is very small and the power consumption of the horizontal driving circuit can be limited to a comparatively small extent. For example, $R_L$=18 kΩ and R=10 kΩ.

A horizontal deflection circuit in a seventh embodiment according to the present invention will be described hereinafter with reference to FIG. 19, in which the horizontal deflection circuit is separated from a high-voltage circuit.

Figure 19:
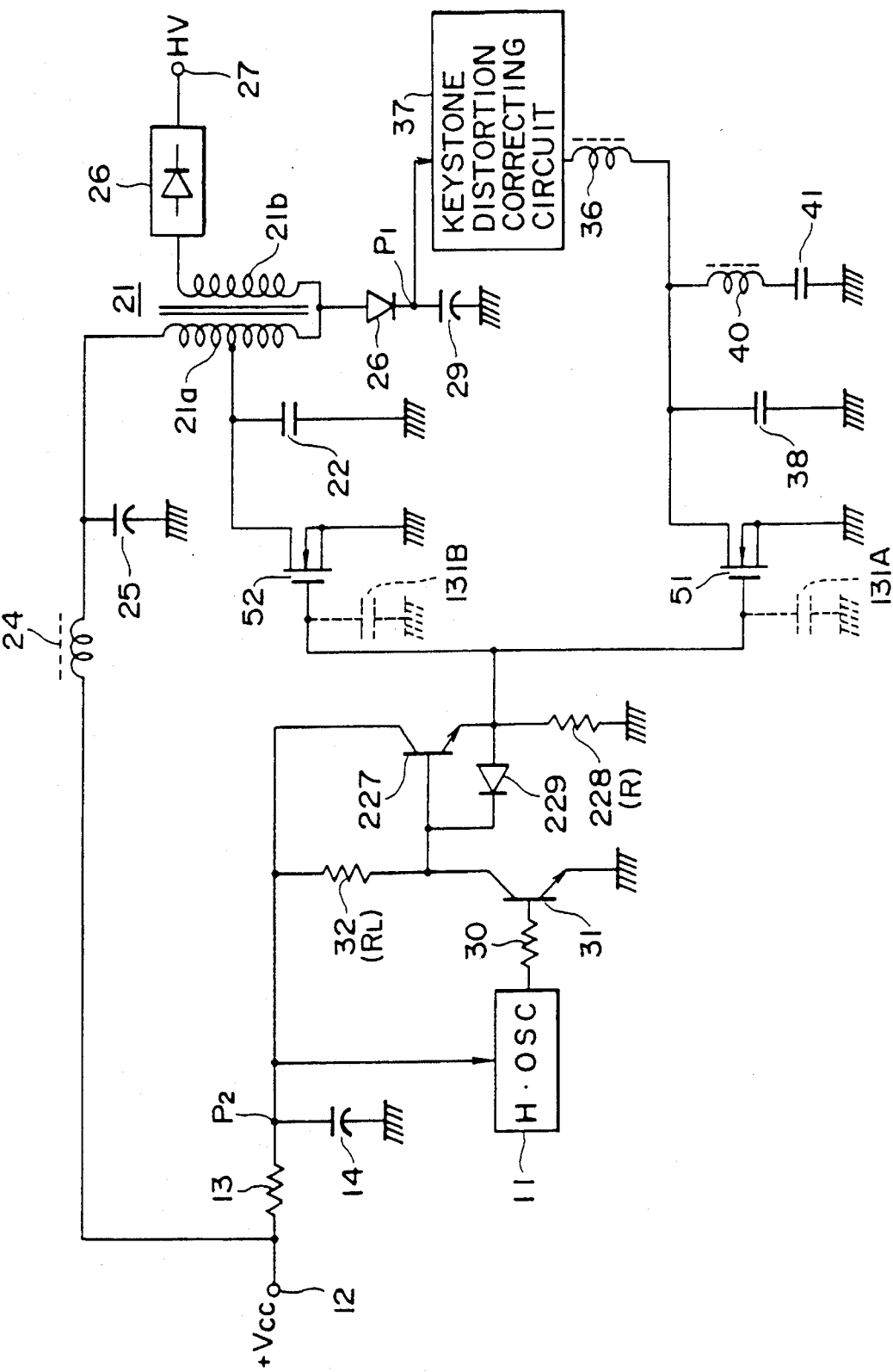
FIG. 19 is a circuit diagram of a separate type of horizontal deflection circuit in a seventh embodiment according to the present invention.

Referring to FIG. 19, the junction point of the emitter of a transistor 227 and a resistor 228 is connected to the gate of an enhancement MOSFET 52 serving as a high-voltage output transistor. The source of the MOSFET 52 is grounded and the drain of the same is connected to the center tap of the primary coil 21a of a FBT 19. The mode of operation of the MOSFET 52 serving as a high-voltage output transistor is the same as that of the MOSFET 52 of the foregoing horizontal output circuit. Since any damping diode is not necessary, the power loss of the high-voltage circuit can be reduced.

Since a horizontal driving circuit is provided on its output side with an emitter follower circuit including a transistor 227, the horizontal driving circuit drives a transistor 31 and the MOSFET 52 with a low impedance. Accordingly, the resistance $R_L$ of a resistor 32 and the resistance R of a resistor 228 of the horizontal driving circuit may be large, so that power loss in the horizontal driving circuit is very small and the power consumption of the horizontal driving circuit can be limited to a comparatively small extent.

Figure 20:
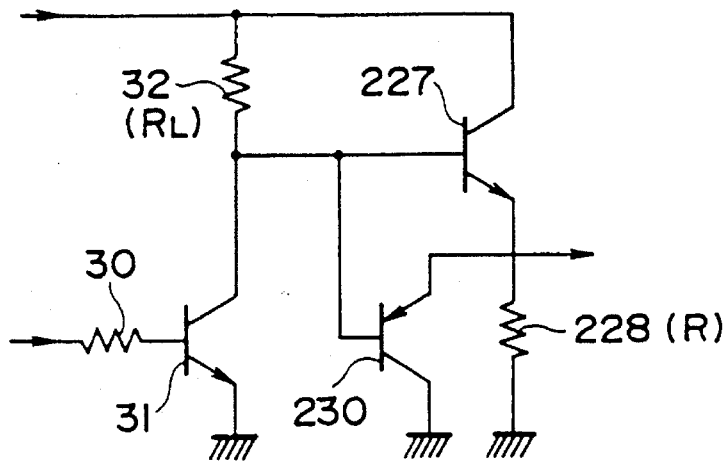
FIG. 20 is a circuit diagram of a portion of a modification of the horizontal deflection circuit of FIG. 19.

In this embodiment, electric charge stored in capacitors 131, 131A and 131B while a transistor 31 is in the OFF state, i.e., while the transistors 227 and 31 are in the ON state, is discharged through a discharge passage provided with a diode 229 when the transistor 31 is turned off. In a modification, the electric charge may be discharged through a discharge passage provided with a pnp transistor 230 as shown in FIG. 20. The transistor 230 has a base connected to the junction point of the collector of the transistor 31 and the load resistor 32, and a collector connected to the ground. The transistors 227 and 230 constitute a SEPP circuit.

In the modification shown in FIG. 20, the transistor 230 is turned on to discharge the electric charge stored in the capacitors 131, 131A and 131B through the emitter and the collector of the transistor 230 when the transistor 31 goes ON and the transistor 227 goes OFF. When this discharge passage provided with the transistor 230 is employed, the saturation voltage $V_{CE(sat)}$ (≈0.2 V) is low as compared with the forward effect voltage $V_f$ (≈0.6 V) and the electric charge can be efficiently discharged.

Thus, the horizontal driving circuit drives the MOSFET serving as a horizontal output transistor with a low impedance and the reduction in the sharpness of the waveform of the horizontal driving pulse for driving the MOSFET can be suppressed. Consequently, the load resistance of the horizontal driving circuit may be large, power loss in the horizontal driving circuit is small and the power consumption of the horizontal driving circuit can be limited to a comparatively small extent.

Figure 21:
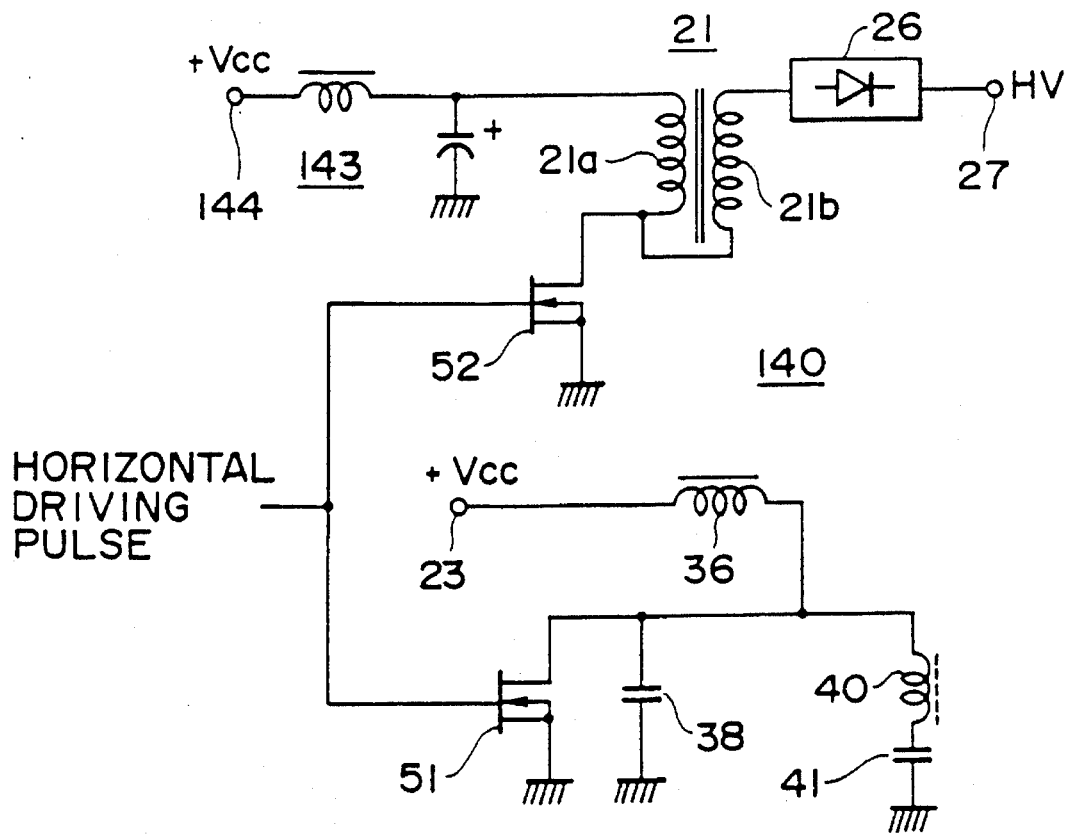
FIG. 21 is a circuit diagram of a high-voltage circuit to be used in combination with the horizontal deflection circuit of FIG. 19.

Referring to FIG. 21, the high-voltage circuit 140 has an n-channel enhancement MOSFET 52 serving as a high-voltage output transistor. A horizontal driving pulse is applied to the gate of the MOSFET 52. The source of the MOSFET 52 is grounded and the drain of the same is connected through the low-voltage coil (the primary coil) 21a of a FBT 21 and a low-pass filter 143 to a power terminal 144 to which a dc voltage $+V_{cc}$ is applied. The high-voltage coil (secondary coil) 21b of the FBT 21 has one end connected through a high-voltage rectifier circuit 26 to a terminal and the other end connected to one end of the low-voltage coil 21a of the FBT 21.

The mode of operation of the MOSFET 52 serving as a high-voltage output transistor is basically the same as that of the MOSFET 51 of the horizontal deflection circuit 20. In the high-voltage circuit 140, any resonant capacitor is not connected to the MOSFET 52, and only the inductance of the low-voltage coil 21a of the FBT 21 and the internal distributed capacitance function as a resonance circuit. A resonance pulse voltage appears at the drain of the MOSFET 52, the high-voltage coil 21b of the FBT 21 provides a raised pulse voltage, and the high-voltage rectifier circuit 26 applies a high voltage HV to the terminal 27.

Since the resonance circuit consists of only the inductance of the low-voltage coil 21a and the internal distributed capacitance, it is not necessary to mount any resonant capacitor on a printed-circuit board and hence the occurrence of troubles including the opening of the resonant capacitor due to faulty assembling work or defects in the wiring pattern of the printed-circuit board can be prevented. Accordingly, use of the high-voltage circuit 140 in combination with the CRT of a television receiver prevents the deterioration of resolution attributable to insufficiently sharp focusing, because a comparatively high voltage can be used.

The high-voltage circuit need not be provided with any protective circuit capable of detecting an abnormally high voltage and of protecting the high-voltage circuit.

Figure 22:
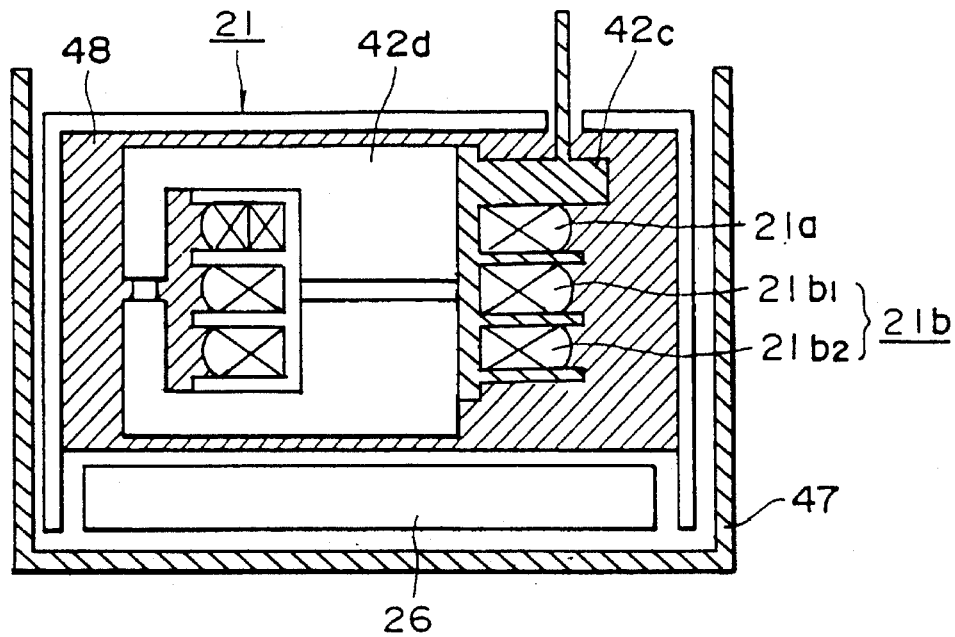
FIG. 22 is a schematic sectional view of a flyback transformer.

Referring to FIG. 22, the FBT 21 has a split slit bobbin 42c having a first slit in which the low-voltage coil 21a is wound, a second slit in which the first high-voltage coil $21b_1$ of the high-voltage coil 21b is wound, and a third slit in which the second high-voltage coil $21b_2$ of the high-voltage coil 21b is wound. One end of the high-voltage coil 21b is connected to the high-voltage rectifier circuit 26. The bobbin 42c is mounted on a core 42d. The FBT 21 is contained in a metallic shielding case 47 and voids between the FBT 21 and the shielding case 47 is filled up with an insulating silicone resin 48 to enhance the dielectric strength.

Figure 23:
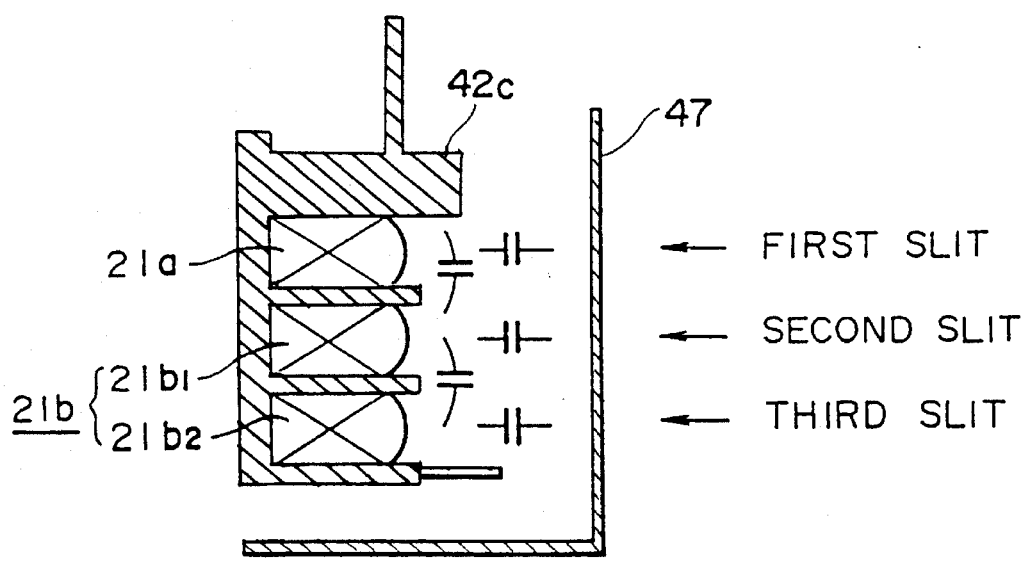
FIG. 23 is a schematic fragmentary view of the flyback transformer of FIG. 22.

As shown in FIG. 23, distributed capacitance exists in the FBT 21 between the shielding case 47, and the coils 21a and 21b and between the low-voltage coil 21a and the high-voltage coil 21b. Since the low-voltage coil 21a and the high-voltage coil 21b are wound separately on the bobbin 42c, the low-voltage coil 21a and the high-voltage coil 21b are weakly coupled and hence the distributed capacitance between the low-voltage coil 21a and the high-voltage coil 21b is comparatively large. Thus the distributed capacitance existing within the FBT 21 is equivalent to the capacitance of a primary resonant capacitor of the high-voltage circuit 140. The dielectric constant of the insulating silicone resin 48 is used positively for producing the distributed capacitance. Since both the low-voltage coil 21a and the high-voltage coil 21b are wound on the single bobbin 42c, the distributed capacitance is distributed more uniformly in the FBT 21 than in a FBT in which the low-voltage coil and the high-voltage coil are wound respectively on separate bobbins.

As mentioned above, leakage flux increases causing raster ringing to deteriorate picture quality when the low-voltage coil 21a and the high-voltage coil 21b are weakly coupled. To prevent the deterioration of picture quality by reducing leakage flux, the high-voltage coil 21b consists of the first high-voltage coil $21b_1$ wound in the second slit, and the second high-voltage coil $21b_2$ wound in the third slit and having a turn number smaller than that of the first high-voltage coil $21b_1$.

Since the resonance circuit consists of only the inductance of the low-voltage coil and the internal distributed capacitance of the FBT, it is not necessary to mount any resonant capacitor on a printed-circuit board and hence the occurrence of troubles including the opening of the resonant capacitor due to faulty assembling work or defects in the wiring pattern of the printed-circuit board can be prevented. Accordingly, the deterioration of resolution attributable to insufficiently sharp focusing can be prevented because a comparatively high voltage can be used. Furthermore, the high-voltage circuit need not be provided with any protective circuit capable of detecting an abnormally high voltage and of protecting the high-voltage circuit.

Since the low-voltage coil and the high-voltage coil of the FBT are wound separately on the single split slit bobbin so that the low-voltage coil and the high-voltage coil are weakly coupled, the distributed capacitance between the low-voltage coil and the high-voltage coil is comparatively large and is uniformly distributed.

Leakage flux in the FBT is reduced by using the high-voltage coil consisting of the first high-voltage coil and the second high-voltage coil having a turn number smaller than that of the first high-voltage coil, so that the use of the FBT reduces the influence of leakage flux on pictures to suppress the deterioration of picture quality.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A horizontal deflection circuit having a horizontal deflection coil and a resonant capacitor, for a television receiver, said horizontal deflection circuit comprising:
  a MOSFET connected at a source terminal to a ground and at a drain terminal to a first end of a primary coil and to a parallel circuit consisting solely of the resonant capacitor connected at a first end to the drain terminal and at a second end to the ground and the horizontal deflection coil connected at a first end to the drain terminal and at a second end to the ground; and
  a driving circuit for supplying a current in one direction to the MOSFET in a part of each horizontal scanning period and for supplying a current in the other direction to the MOSFET in the rest of each horizontal scanning period so that a sawtooth current flows through the horizontal deflection coil.

2. The horizontal deflection circuit according to claim 1, wherein the driving circuit has a switching element directly connected to a gate of the MOSFET, and wherein the MOSFET is in an OFF-state when the switching element is in an ON-state and the MOSFET is in the ON-state when the switching element is in the OFF-state.

3. The horizontal deflection circuit according to claim 1, further comprising a horizontal oscillation circuit for supplying a horizontal deflection signal to the horizontal driving circuit, and a power supply for supplying power to both the horizontal driving circuit and the horizontal oscillation circuit.

4. The horizontal deflection circuit according to claim 1, wherein a resistance element is connected across a gate terminal and the source terminal of the MOSFET.

5. The horizontal deflection circuit according to claim 1, wherein the MOSFET, the resonant capacitor, and the horizontal deflection coil are included in a high-voltage circuit, and a resistance element is connected across a gate terminal and the source terminal of the MOSFET.

6. The horizontal deflection circuit according to claim 1, wherein the horizontal driving circuit that drives the MOSFET has a low impedance.

7. The horizontal deflection circuit according to claim 1, wherein the horizontal driving circuit is provided on its output side with impedance converting means.

8. The horizontal deflection circuit according to claim 7, wherein the impedance converting means is an emitter follower circuit.

9. The horizontal deflection circuit according to claim 5, wherein the high-voltage circuit has an inductance of a low-voltage coil of a flyback transformer and an internal distributed capacitance equivalent to a resonance circuit.

10. The horizontal deflection circuit according to claim 9, wherein the flyback transformer comprises a split slit bobbin, a low-voltage coil, and a high-voltage coil wound separately on the split slit bobbin so that the low-voltage coil and the high-voltage coil are weakly coupled.

11. The horizontal deflection circuit according to claim 10, wherein the high-voltage coil consists of a first high-voltage coil wound adjacent to the low-voltage coil on the split slit bobbin and a second high-voltage coil wound adjacent to the first high-voltage coil on the split slit bobbin, wherein a turn number of the first high-voltage coil is not smaller than that of the second high-voltage coil.

12. The horizontal deflection circuit according to claim 1, further comprising a distortion correcting capacitor connected between the second end of the horizontal deflection coil and ground.

* * * * *